US010884338B2

(12) United States Patent
Kamimura

(10) Patent No.: US 10,884,338 B2
(45) Date of Patent: Jan. 5, 2021

(54) CHEMICAL LIQUID, CHEMICAL LIQUID STORAGE BODY, MANUFACTURING METHOD OF CHEMICAL LIQUID, AND MANUFACTURING METHOD OF CHEMICAL LIQUID STORAGE BODY

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 21 days.

(21) Appl. No.: 16/366,621

(22) Filed: Mar. 27, 2019

(65) Prior Publication Data

US 2019/0219924 A1 Jul. 18, 2019

Related U.S. Application Data

(63) Continuation of application No. PCT/JP2017/028505, filed on Aug. 7, 2017.

(30) Foreign Application Priority Data

Sep. 28, 2016 (JP) .................................. 2016-189867

(51) Int. Cl.
*H01L 21/02* (2006.01)
*G03F 7/32* (2006.01)
*G03F 7/20* (2006.01)
*B01D 61/18* (2006.01)
*B01D 61/20* (2006.01)
*B01D 71/64* (2006.01)
*G03F 7/16* (2006.01)
*C11D 7/50* (2006.01)
*C11D 7/04* (2006.01)
*G03F 7/30* (2006.01)
*C11D 7/10* (2006.01)
*C11D 17/08* (2006.01)
*G03F 7/004* (2006.01)
*G03F 7/00* (2006.01)
*C11C 3/00* (2006.01)
*B01D 61/58* (2006.01)
*B01D 61/36* (2006.01)
*B01D 61/14* (2006.01)

(52) U.S. Cl.
CPC ............ *G03F 7/325* (2013.01); *B01D 61/18* (2013.01); *B01D 61/20* (2013.01); *B01D 61/58* (2013.01); *B01D 71/64* (2013.01); *C11C 3/00* (2013.01); *C11D 7/04* (2013.01); *C11D 7/10* (2013.01); *C11D 7/50* (2013.01); *C11D 7/5004* (2013.01); *C11D 17/08* (2013.01); *G03F 7/0012* (2013.01); *G03F 7/0048* (2013.01); *G03F 7/16* (2013.01); *G03F 7/3057* (2013.01); *G03F 7/7095* (2013.01); *G03F 7/70991* (2013.01); *B01D 61/147* (2013.01); *B01D 61/362* (2013.01); *B01D 2311/10* (2013.01); *B01D 2311/22* (2013.01); *B01D 2311/2623* (2013.01); *B01D 2311/2626* (2013.01); *B01D 2311/2649* (2013.01); *B01D 2313/50* (2013.01); *B01D 2325/16* (2013.01); *B01D 2325/30* (2013.01); *B01D 2325/42* (2013.01)

(58) Field of Classification Search
CPC ........................... C11D 11/0047; H01L 24/03
USPC .......................................... 510/175; 438/381
See application file for complete search history.

(56) References Cited

U.S. PATENT DOCUMENTS

| 2015/0227049 A1 | 8/2015 | Yamanaka et al. | |
| 2016/0314991 A1* | 10/2016 | Ogihara | G03F 7/0397 |
| 2017/0216814 A1* | 8/2017 | Hirano | B01J 20/3212 |
| 2017/0309492 A1* | 10/2017 | Takahashi | H01L 21/304 |
| 2017/0314092 A1* | 11/2017 | Nakamura | C22C 38/04 |

FOREIGN PATENT DOCUMENTS

| JP | 2003-278972 A | 10/2003 |
| JP | 2006-269677 A | 10/2006 |
| JP | 2007-234814 A | 9/2007 |
| JP | 2008-235301 A | 10/2008 |
| JP | 2013-218308 A | 10/2013 |

(Continued)

OTHER PUBLICATIONS

International Search Report dated Nov. 7, 2017 from the International Searching Authority in counterpart International Application No. PCT/JP2017/028505.

(Continued)

*Primary Examiner* — Gregory E Webb
(74) *Attorney, Agent, or Firm* — Sughrue Mion, PLLC

(57) ABSTRACT

An object of the present invention is to provide a chemical liquid which has excellent defect inhibition performance and hardly breaks a transfer pipe line that a device for manufacturing the chemical liquid includes at the time of manufacturing the chemical liquid. Another object of the present invention is to provide a chemical liquid storage body, a manufacturing method of a chemical liquid, and a manufacturing method of a chemical liquid storage body. The chemical liquid according to an embodiment of the present invention is a chemical liquid containing an organic solvent and an ion of at least one kind of atom selected from the group consisting of an Fe atom, a Cr atom, a Ni atom, and a Pb atom, in which in a case where the chemical liquid contains one kind of the ion, a content of the metal ion is 0.1 to 100 mass ppt, in a case where the chemical liquid contains two or more kinds of the ions, a content of each of the metal ions is 0.1 to 100 mass ppt, and a charge potential is equal to or lower than 100 mV.

22 Claims, No Drawings

(56) References Cited

FOREIGN PATENT DOCUMENTS

JP      2015-007807  A    1/2015
WO      2016024541   A1   2/2016

OTHER PUBLICATIONS

International Preliminary Report on Patentability dated Apr. 2, 2019 from the International Bureau in counterpart International Application No. PCT/ JP2017/028505.
Written Opinion dated Nov. 7, 2017 from the International Bureau in counterpart International Application No. PCT/JP2017/028505.
Notice of Reasons for Refusal dated Mar. 24, 2020, from the Japanese Patent Office in Application No. 2018-541969.
International Preliminary Report on Patentability dated Apr. 2, 2019 from the International Bureau in counterpart International Application No. PCTJP/028505.

* cited by examiner

CHEMICAL LIQUID, CHEMICAL LIQUID STORAGE BODY, MANUFACTURING METHOD OF CHEMICAL LIQUID, AND MANUFACTURING METHOD OF CHEMICAL LIQUID STORAGE BODY

CROSS-REFERENCE TO RELATED APPLICATIONS

This application is a Continuation of PCT International Application No. PCT/JP2017/028505 filed on Aug. 7, 2017, which claims priority under 35 U.S.C. § 119(a) to Japanese Patent Application No. 2016-189867 filed on Sep. 28, 2016. The above application is hereby expressly incorporated by reference, in its entirety, into the present application.

BACKGROUND OF THE INVENTION

1. Field of the Invention

The present invention relates to a chemical liquid, a chemical liquid storage body, a manufacturing method of a chemical liquid, and a manufacturing method of a chemical liquid storage body.

2. Description of the Related Art

Conventionally, in a process of manufacturing a semiconductor device such as an Integrated Circuit (IC) or a Large Scale Integrated circuit (LSI), microfabrication is performed by lithography by using a photoresist composition.

In the lithography, a method is used in which a film is formed of a photoresist composition (an actinic ray-sensitive or radiation-sensitive resin composition which is also called chemical amplification-type resist composition), the obtained film is then developed using a developer, and the developed film is washed with a rinse solution. In addition, in order to improve the wettability of the photoresist composition with respect to a substrate, before the substrate is coated with the photoresist composition, a prewet solution is brought into contact with the surface of the substrate.

JP2015-007807A describes "an organic treatment solution for patterning a chemical amplification-type resist film, containing an alkylolefin having 22 or less carbon atoms in an amount equal to or smaller than 1 ppm, in which the concentration of all the metal elements of Na, K, Ca, Fe, Cu, Mg, Mn, Li, Al, Cr, Ni, and Zn is equal to or lower than 5 ppm, the organic treatment solution is an organic developer, and the total moisture content in the developer is less than 10% by mass".

SUMMARY OF THE INVENTION

Today, in the technical field of chemical liquids, the further improvement of defect inhibition performance is being required. The inventors of the present invention examined the organic treatment solution for patterning a chemical amplification-type resist film described in JP2015-007807A. As a result, the inventors have found that although the treatment solution has excellent defect inhibition performance, unfortunately, a transfer pipe line (for example, a pipe, a pump, or the like) that a device for manufacturing the treatment solution comprises is broken in some cases at the time of manufacturing the treatment solution.

Therefore, an object of the present invention is to provide a chemical liquid which has excellent defect inhibition performance and hardly breaks a transfer pipe line that a device for manufacturing the chemical liquid comprises at the time of manufacturing the chemical liquid (hereinafter, described as "excellent pipe line breakage inhibition performance").

Another object of the present invention is to provide a chemical liquid storage body, a manufacturing method of a chemical liquid, and a manufacturing method of a chemical liquid storage body.

In order to achieve the aforementioned objects, the inventors of the present invention carried out an intensive examination. As a result, the inventors have found that the objects can be achieved by the following constitution.

[1] A chemical liquid comprising an organic solvent and an ion of at least one kind of atom selected from the group consisting of an Fe atom, a Cr atom, a Ni atom, and a Pb atom, in which in a case where the chemical liquid contains one kind of the ion, a content of the ion is 0.1 to 100 mass ppt, in a case where the chemical liquid contains two or more kinds of the ions, a content of each of the ions is 0.1 to 100 mass ppt, and a charge potential of the chemical liquid is equal to or lower than 100 mV.

[2] The chemical liquid described in [1], further comprising particles containing at least one kind of atom selected from the group consisting of a Cr atom, a Zn atom, an Al atom, and a Pb atom, in which a content of the particles in the chemical liquid with respect to the total mass of the chemical liquid is 0.1 to 100 mass ppt.

[3] The chemical liquid described in [1] or [2], further comprising an organic impurity, in which a total content of the organic impurity in the chemical liquid is 1 to 5,000 mass ppm.

[4] The chemical liquid described in any one of [1] to [3], in which the number of objects to be counted having a size equal to or greater than 0.1 µm that are counted by a light scattering-type liquid-borne particle counter is 1 to 100/mL.

[5] The chemical liquid described in any one of [1] to [4], further comprising water, in which a content of the water in the chemical liquid is 0.01% to 1% by mass.

[6] The chemical liquid described in any one of [1] to [5], in which the organic solvent contains at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol.

[7] A chemical liquid storage body comprising a container and the chemical liquid described in any one of [1] to [6] that is stored in the container, in which a liquid contact portion, which contacts the chemical liquid, in the container is formed of a metallic material containing a Cr atom and an Fe atom, and the metallic material is at least one kind of material selected from the group consisting of stainless steel and electropolished stainless steel.

[8] The chemical liquid storage body described in [7], in which a mass ratio of a content of the Cr atom to a content of the Fe atom in the metallic material is higher than 0.5 and less than 3.5.

[9] A manufacturing method of a chemical liquid that is for manufacturing the chemical liquid described in any one of [1] to [6], comprising an organic solvent preparation step of preparing an organic solvent and a filtering step of passing a substance to be purified containing the organic solvent through a filter so as to obtain a chemical liquid, in which the filtering step satisfies a condition 1 and a condition 2 described below.

Condition 1: at the time when the substance to be purified passes through the filter, a temperature of the substance to be purified is lower than 23° C.

Condition 2: at the time when the substance to be purified passes through the filter, a temperature of the substance to be purified satisfies Expression 1.

(Expression 1) a temperature of the substance to be purified<a flashing point of the organic solvent−5

In Expression 1, the unit of each of the temperature of the substance to be purified and the flashing point of the organic solvent is ° C.

[10] A manufacturing method of a chemical liquid storage body that is for manufacturing the chemical liquid storage body described in [7] or [8], comprising an organic solvent preparation step of preparing an organic solvent, a filtering step of passing a substance to be purified containing the organic solvent through a filter so as to obtain a chemical liquid, and a storing step of storing the chemical liquid in a container so as to obtain a chemical liquid storage body, in which the filtering step and the storing step satisfy a condition 3 and a condition 4 described below.

Condition 3: at the time when the substance to be purified passes through the filter, a temperature of the substance to be purified is lower than 23° C., and at the time when the chemical liquid is stored in the container, a temperature of the chemical liquid is lower than 23° C.

Condition 4: at the time when the substance to be purified passes through the filter, a temperature of the substance to be purified satisfies Expression 1, and at the time when the chemical liquid is stored in the container, a temperature of the chemical liquid satisfies Expression 2.

(Expression 1) a temperature of the substance to be purified<a flashing point of the organic solvent−5

(Expression 2) a temperature of the chemical liquid<a flashing point of the organic solvent−5

In Expression 1 and Expression 2, the unit of each of the temperature of the substance to be purified, the temperature of the chemical liquid, and the flashing point of the organic solvent is ° C.

According to the present invention, it is possible to provide a chemical liquid which has excellent defect inhibition performance and excellent pipe line breakage inhibition performance (hereinafter, described as "has the effects of the present invention" as well).

Furthermore, according to the present invention, it is possible to provide a chemical liquid storage body, a manufacturing method of a chemical liquid, and a manufacturing method of a chemical liquid storage body.

DESCRIPTION OF THE PREFERRED EMBODIMENTS

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as electron beams or ion beams.

[Chemical Liquid]

The aforementioned chemical liquid is a chemical liquid containing an organic solvent and an ion of at least one kind of atom selected from the group consisting of an Fe atom, a Cr atom, a Ni atom, and a Pb atom (hereinafter, the ion will be referred to as "metal ion" as well), in which in a case where the chemical liquid contains one kind of the metal ion, the content of the metal ion is 0.1 to 100 mass ppt, in a case where the chemical liquid contains two or more kinds of the metal ion, the content of each of the metal ions is 0.1 to 100 mass ppt, and a charge potential is equal to or lower than 100 mV.

The inventors of the present invention have found that in a case where the content of the metal ion (in a case where the chemical liquid contains two or more kinds of metal ions, the content of each of the metal ions) in the chemical liquid with respect to the total mass of the chemical liquid is equal to or smaller than 100 mass ppt, the chemical liquid has further improved defect inhibition performance.

Furthermore, by the inventors of the present invention, it has been first revealed that in a case where a treatment solution with a reduced metal ion content is manufactured, due to the friction between the treatment solution or the like (or a raw material solution thereof or the like) and a transfer pipe line that occurs when the treatment solution or the like flows in the pipe line, the treatment solution or the like is charged, and the charging causes the breakage of the transfer pipe line that occurs in some cases at the time of manufacturing the treatment solution. This tendency becomes apparent particularly in a case where the treatment solution or the like with a reduced metal ion content is caused to flow in a transfer pipe line in which a liquid contact portion contacting the treatment solution or the like is made of a resin.

In contrast, in the chemical liquid according to the embodiment of the present invention, the content of the metal ion (in a case where the chemical liquid contains two or more kinds of metal ions, the content of each of the metal ions) with respect to the total mass of the chemical liquid is equal to or smaller than 100 mass ppt, and the charge potential is equal to or lower than 100 mV. Presumably, as a result, the chemical liquid may have the effects of the present invention. Hereinafter, each of the components contained in the chemical liquid will be specifically described.

The chemical liquid contains an organic solvent.

As the organic solvent, known organic solvents can be used without particular limitation.

The content of the organic solvent in the chemical liquid is not particularly limited. However, it is preferable that the chemical liquid contains the organic solvent as a main component. Specifically, the content of the organic solvent with respect to the total mass of the chemical liquid is preferably equal to or greater than 98% by mass, more preferably equal to or greater than 99% by mass, even more preferably equal to or greater than 99.5% by mass, and particularly preferably equal to or greater than 99.8% by mass. The upper limit of the content of the organic solvent is not particularly limited, but is preferably equal to or smaller than 99.99% by mass in general. One kind of organic solvent may be used singly, or two or more kinds of organic solvents may be used in combination. In a case where two or more kinds of organic solvents are used in combination, the total content thereof is preferably within the above range.

The content of the organic solvent in the chemical liquid can be measured using gas chromatography mass spectrometry (GCMS). The measurement conditions and the like are as described in Examples which will be described later.

The boiling point of the organic solvent is not particularly limited. However, in view of obtaining a chemical liquid having further improved effects of the present invention, the boiling point of the organic solvent is preferably lower than 200° C.

In the present specification, the boiling point means a boiling point at 1 atm.

The organic solvent is not particularly limited, and examples thereof include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-pentanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methyl cyclohexanol, trimethyl cyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α,α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2,2-trifluoroethyl ether, ethyl vinyl ether, butyl vinyl ether, allyl ethyl ether, allyl propyl ether, allyl butyl ether, diallyl ether, 2-methoxypropene, ethyl-1-propenylether, cis-1-bromo-2-ethoxyethylene, 2-chloroethyl vinyl ether, allyl-1,1,2,2-tetrafluoroethyl ether, octane, isooctane, nonane, decane, methyl cyclohexane, decalin, xylene, ethyl benzene, diethyl benzene, cumene, sec-butyl benzene, cymene, dipentene, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, isoamyl acetate, chloroform, dichloromethane, 1,4-dioxane, hexyl alcohol, γ-butyrolactone, 2-heptanone, tetrahydrofuran, and the like.

Among these, in view of obtaining a chemical liquid having further improved effects of the present invention, it is more preferable that the chemical liquid contains, as the organic solvent, at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol.

In a case where the solvent contains two or more kinds of organic solvents, the combination of the organic solvents contained in the chemical liquid is not particularly limited. In a case where the chemical liquid contains two or more kinds of organic solvents, in view of obtaining a chemical liquid having further improved effects of the present invention, it is preferable that the organic solvents have different boiling points, different solubility parameters, and/or different dielectric constants.

For example, a chemical liquid containing two or more kinds of organic solvents having different dielectric constants has further improved defect inhibition performance, although the reason is unclear. Presumably, this is because the occurrence of a defect by static electricity may be further inhibited.

In a case where the chemical liquid contains two or more kinds of organic solvents, it is preferable that the chemical liquid contains two or more kinds of ethers as the organic solvents. The chemical liquid containing two or more kinds of ethers (corresponding to organic solvents) has further improved defect inhibition performance.

As the ethers, known ethers can be used without particular limitation. As the two or more kinds of ethers, for example, two or more kinds of ethers are preferable which are selected from the group consisting of propylene glycol monomethyl ether acetate, propylene glycol monomethyl ether, diethylene glycol monomethyl ether, diethylene glycol monoethyl ether, and diethylene glycol monobutyl ether.

It is preferable that the organic solvents contain propylene glycol monomethyl ether acetate and propylene glycol monomethyl ether among the above.

In a case where the chemical liquid contains two or more kinds of organic solvents, the mass ratio of the organic solvents in the chemical liquid is not particularly limited but is preferably 1/99 to 99/1 in general, more preferably 10/90 to 90/10, and even more preferably 20/80 to 60/40.

In a case where the chemical liquid contains three or more kinds of organic solvents, the combination of the three or more kinds of organic solvents is not particularly limited, but the following combinations of organic solvents and the like are preferable.

Propylene glycol monomethyl ether acetate (PGMEA)/propylene glycol monomethyl ether (PGME)/γ-butyrolactone PGMEA/PGME/cyclohexanone PGMEA/PGME/2-heptanone PGMEA/cyclohexanone/γ-butyrolactone PGMEA/γ-butyrolactone/2-heptanone

[Metal Ion]

The chemical liquid contains an ion (metal ion) of at least one kind of atom (specific metal atom 1) selected from the group consisting of an Fe atom, a Cr atom, a Ni atom, and a Pb atom.

In the present specification, the metal ion and particles which will be described later are collectively referred to as "metal impurity" in some cases.

In a case where the chemical liquid contains one kind of metal ion, the content of the metal ion with respect to the total mass of the chemical liquid is 0.1 to 100 mass ppt. In a case where the chemical liquid contains two or more kinds of metal ions, the content of each of the metal ions with respect to the total mass of the chemical liquid is 0.1 to 100 mass ppt. Particularly, in view of obtaining a chemical liquid having further improved effects of the present invention, the content of the metal ion (in a case where the chemical liquid contains two or more kinds of metal ions, the content of each of the metal ions) is preferably 0.1 to 50 mass ppt.

In a case where the content of the metal ion (in a case where the chemical liquid contains two or more kinds of metal ions, the content of each of the metal ions) in the chemical liquid is equal to or greater than 0.1 mass ppt, charging of the chemical liquid can be controlled, and the chemical liquid has further improved defect inhibition performance. In a case where the content of the metal ion in the chemical liquid is equal to or smaller than 100 mass ppt, the chemical liquid has further improved defect inhibition performance.

The content of the metal ion in the chemical liquid can be measured using inductively coupled plasma mass spectrometry (ICP-MS, for example, Agilent 8800 ICP-MS).

In a case where the chemical liquid contains two or more kinds of metal ions, the total content of the metal ions with respect to the total mass of the chemical liquid is preferably 0.1 to 500 mass ppt, more preferably 1.0 to 250 mass ppt, even more preferably equal to or smaller than 200 mass ppt, particularly preferably equal to or smaller than 150 mass ppt, more particularly preferably equal to or smaller than 100 mass ppt, and most preferably equal to or smaller than 50 mass ppt.

The metal ion may be added to the chemical liquid or may be unintentionally mixed into the chemical liquid in the manufacturing process of the chemical liquid. Examples of the case where the metal ion is unintentionally mixed into the chemical liquid in the manufacturing process of the chemical liquid include a case where the metal ion is contained in a raw material (for example, an organic solvent) used for manufacturing the chemical liquid, a case where the metal ion is mixed into the chemical liquid in the manufacturing process of the chemical liquid (for example, contamination), and the like. However, the present invention is not limited to these.

Particularly, in view of causing the chemical liquid to have further improved effects of the present invention, it is preferable that the chemical liquid contains an ion of each of an Fe atom, a Cr atom, a Ni atom, and a Pb atom. In view of obtaining a chemical liquid having further improved effects of the present invention, the content of each of the metal ions with respect to the total mass of the chemical liquid is more preferably as described below.

Fe ion: 0.1 to 50 mass ppt (preferably 0.1 to 10 mass ppt)
Cr ion: 0.1 to 30 mass ppt (preferably 0.1 to 10 mass ppt)
Ni ion: 0.1 to 50 mass ppt (preferably 0.1 to 10 mass ppt)
Pb ion: 0.1 to 30 mass ppt (preferably 0.1 to 10 mass ppt)

The treatment solution for a semiconductor containing the metal ion of the specific metal atom 1 is particularly easily charged, and in a case where the treatment solution is used as a developer and/or a prewet solution or the like, the metal ion of the specific metal atom 1 easily remains as a defect on a substrate such as a silicon wafer.

The chemical liquid in which the content of the metal ion of the specific metal atom 1 is within the above range has a further improved defect inhibition performance, makes it easier to control the charge potential of the chemical liquid in a low charge potential state, and has further improved pipe line breakage inhibition performance.

[Optional Components]

As long as the effects of the present invention are exhibited, the chemical liquid may contain components other than the above components. Examples of the components other than the above components include particles containing metal atoms, an organic impurity, water, and the like. Hereinafter, the optional components will be specifically described.

<Particles (Particles Containing Metal Atoms)>

The chemical liquid may contain particles containing metal atoms. Particularly, in view of obtaining a chemical liquid having further improved effects of the present invention, it is preferable that the chemical liquid contains particles containing at least one kind of atom (specific metal atom 2) selected from the group consisting of a Cr atom, a Zn atom, an Al atom, and a Pb atom.

The average particle diameter of the particles containing metal atoms is not particularly limited, but is preferably equal to or smaller than 20 nm in general. The average particle diameter of the particles containing metal atoms means the average particle diameter measured by a defect inspection device SP-5 and/or a defect review-sorting device G6.

As the particles containing metal atoms, known particles can be used without particular limitation. The content of the particles in the chemical liquid is not particularly limited, but is preferably 0.05 to 200 mass ppt in general with respect to the total mass of the chemical liquid. In view of obtaining a chemical liquid having further improved effects of the present invention, the content of the particles is more preferably 0.1 to 100 mass ppt, and even more preferably 1.0 to 60 mass ppt.

As the particles, one kind of particles may be used singly, or two or more kinds of particles may be used in combination. In a case where two or more kinds of particles are used in combination, the total content thereof is preferably within the above range.

In a case where the content of the particles in the chemical liquid is equal to or greater than 0.1 mass ppt, the chemical liquid has further improved defect inhibition performance.

In contrast, in a case where the content of the particles in the chemical liquid is equal to or smaller than 100 mass ppt, the chemical liquid has further improved pipe line breakage inhibition performance. Generally, it is considered that because the specific metal atom 2 and the material (for example, polytetrafluoroethylene or the like) of the transfer pipe line are separated from each other in the triboelectric series, the chemical liquid containing the specific metal atom 2 may be easily charged. However, presumably, in a case where the content of the particles is equal to or smaller than 100 mass ppt, the influence of the particles may be further reduced, and as a result, the chemical liquid may have further improved pipe line breakage inhibition performance.

The content of the particles in the chemical liquid can be measured using inductively coupled plasma mass spectrometry (ICP-MS, for example, Agilent 8800 ICP-MS).

As the metal atoms contained in the particles, one kind of metal atoms may be used singly, or two or more kinds of metal atoms may be used in combination.

The particles may be added to the chemical liquid or may be unintentionally mixed into the chemical liquid in the manufacturing process of the chemical liquid. Examples of the case where the particles are unintentionally mixed into the chemical liquid in the manufacturing process of the chemical liquid include a case where the particles are contained in a raw material (for example, an organic solvent) used for manufacturing the chemical liquid, a case where the particles are mixed into the chemical liquid in the manufacturing process of the chemical liquid (for example, contamination), and the like. However, the present invention is not limited to these.

Particularly, in view of causing the chemical liquid to have further improved effects of the present invention, it is preferable that the chemical liquid contains particles containing each of the Fe atom, the Zn atom, the Al atom, and the Pb atom. In this case, the content of each of the particles in the chemical liquid is not particularly limited. In view of obtaining a chemical liquid having further improved effects of the present invention, the content of each of the particles with respect to the total mass of the chemical liquid is more preferably as described below.

Particles containing Fe atoms: 0.1 to 30 mass ppt
Particles containing Zn atoms: 0.1 to 20 mass ppt
Particles containing Al atoms: 0.1 to 20 mass ppt
Particles containing Pb atoms: 0.1 to 20 mass ppt <Organic Impurity>

It is preferable that the chemical liquid contains an organic impurity.

In the present specification, the organic impurity means an organic substance as a compound which is different from the organic solvent contained in the chemical liquid as a main component and is contained in the chemical liquid in an amount equal to or smaller than 5,000 mass ppm with respect to the total mass of the chemical liquid. That is, in the present specification, an organic substance which is contained in the chemical liquid in an amount equal to or smaller than 5,000 mass ppm with respect to the total mass of the chemical liquid corresponds to an organic impurity but does not correspond to an organic solvent.

In a case where the chemical liquid contains an organic impurity formed of a plurality of kinds of compounds, as long as each of the compounds corresponds to the aforementioned organic substance which is contained in the chemical liquid in an amount equal to or smaller than 5,000 mass ppm, each of the compounds corresponds to the organic impurity.

The total content of the organic impurity in the chemical liquid is not particularly limited. However, generally, the total content of the organic impurity with respect to the total mass of the chemical liquid is preferably 0.05 to 10,000 mass ppm, more preferably 0.1 to 5,000 mass ppm, even more preferably equal to or smaller than 3,000 mass ppm, particularly preferably equal to or smaller than 1,000 mass ppm, and most preferably equal to or smaller than 650 mass ppm.

In a case where the total content of the organic impurity in the chemical liquid is equal to or greater than 0.1 mass ppm, the chemical liquid has further improved defect inhibition performance. In a case where the total content of the organic impurity in the chemical liquid is equal to or smaller than 5,000 mass ppm, the chemical liquid has further improved further improved defect inhibition performance.

One kind of organic impurity may be used singly, or two or more kinds of organic impurities may be used in combination. In a case where two or more kinds of organic impurities are used in combination, the total content thereof is preferably within the above range.

The total content of the organic impurity in the chemical liquid can be measured using gas chromatography mass spectrometry (GCMS).

The organic impurity may be added to the chemical liquid or may be unintentionally mixed into the chemical liquid in the manufacturing process of the chemical liquid. Examples of the case where the organic impurity is unintentionally mixed into the chemical liquid in the manufacturing process of the chemical liquid include a case where the organic impurity is contained in a raw material (for example, an organic solvent) used for manufacturing the chemical liquid, a case where the organic impurity is mixed into the chemical liquid the manufacturing process of the chemical liquid (for example, contamination), and the like. However, the present invention is not limited to these.

Examples of the organic impurity include antioxidants such as dibutylhydroxytoluene (BHT), distearylthiodipropionate (DSTP), 4,4'-butylidenebis-(6-t-butyl-3-methylphenol), 2,2'-methylenebis-(4-ethyl-6-t-butylphenol), and the antioxidants described in JP2015-200775A; unreacted raw materials; structural isomers and byproducts produced at the time of manufacturing the organic solvent; substances eluted from members constituting an organic solvent manufacturing device and the like (for example, a plasticizer eluted from a rubber member such as an O-ring); and the like.

Examples of the organic impurity include byproducts generated at the time of synthesizing the organic solvent and/or unreacted raw materials (hereinafter, referred to as "byproduct and the like" as well), and the like. For example, in a case where the organic solvent is an alcohol compound, a ketone compound, an ester compound, an ether compound, and an aldehyde compound, examples of the byproduct and the like include an alcohol compound, a ketone compound, an ester compound, an ether compound, an aldehyde compound, and the like.

Examples of the byproduct and the like include compounds represented by Formulae I to V, and the like.

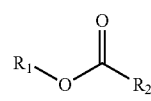

I

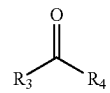

II

III

IV

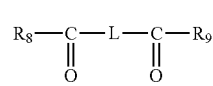

V

In Formula I, $R_1$ and $R_2$ each independently represent an alkyl group or a cycloalkyl group. Alternatively, $R_1$ and $R_2$ form a ring by being bonded to each other.

As the alkyl group or the cycloalkyl group represented by $R_1$ and $R_2$, an alkyl group having 1 to 12 carbon atoms or a cycloalkyl group having 6 to 12 carbon atoms is preferable, and an alkyl group having 1 to 8 carbon atoms or a cycloalkyl group having 6 to 8 carbon atoms is more preferable.

The ring formed of $R_1$ and $R_2$ bonded to each other is a lactone ring, preferably a 4- to 9-membered lactone ring, and more preferably a 4- to 6-membered lactone ring.

It is preferable that $R_1$ and $R_2$ satisfy a relationship in which the number of carbon atoms in the compound represented by Formula I becomes equal to or greater than 6.

In Formula II, $R_3$ and $R_4$ each independently represent a hydrogen atom, an alkyl group, an alkenyl group, a cycloalkyl group, or a cycloalkenyl group. Alternatively, $R_3$ and $R_4$ form a ring by being bonded to each other. Here, $R_3$ and $R_4$ do not simultaneously represent a hydrogen atom.

As the alkyl group represented by $R_3$ and $R_4$, for example, an alkyl group having 1 to 12 carbon atoms is preferable, and an alkyl group having 1 to 8 carbon atoms is more preferable.

As the alkenyl group represented by $R_3$ and $R_4$, for example, an alkenyl group having 2 to 12 carbon atoms is preferable, and an alkenyl group having 2 to 8 carbon atoms is more preferable.

As the cycloalkyl group represented by $R_3$ and $R_4$, for example, a cycloalkyl group having 6 to 12 carbon atoms is preferable, and a cycloalkyl group having 6 to 8 carbon atoms is more preferable.

As the cycloalkenyl group represented by $R_3$ and $R_4$, for example, a cycloalkenyl group having 3 to 12 carbon atoms is preferable, and a cycloalkenyl group having 6 to 8 carbon atoms is more preferable.

The ring formed of $R_3$ and $R_4$ bonded to each other is a cyclic ketone structure which may be a saturated cyclic ketone or an unsaturated cyclic ketone. The cyclic ketone is preferably a 6- to 10-membered ring, and more preferably a 6- to 8-membered ring.

It is preferable that $R_3$ and $R_4$ satisfy a relationship in which the number of carbon atoms in the compound represented by Formula II becomes equal to or greater than 6.

In Formula III, $R_5$ represents an alkyl group or a cycloalkyl group.

As the alkyl group represented by $R_5$, an alkyl group having 6 or more carbon atoms is preferable, an alkyl group having 6 to 12 carbon atoms is more preferable, and an alkyl group having 6 to 10 carbon atoms is even more preferable.

The alkyl group may have an ether bond in the chain thereof or may have a substituent such as a hydroxy group.

As the cycloalkyl group represented by $R_5$, a cycloalkyl group having 6 or more carbon atoms is preferable, a cycloalkyl group having 6 to 12 carbon atoms is more preferable, and a cycloalkyl group having 6 to 10 carbon atoms is even more preferable.

In Formula IV, $R_6$ and $R_7$ each independently represent an alkyl group or a cycloalkyl group. Alternatively, $R_6$ and $R_7$ form a ring by being bonded to each other.

As the alkyl group represented by $R_6$ and $R_7$, an alkyl group having 1 to 12 carbon atoms is preferable, and an alkyl group having 1 to 8 carbon atoms is more preferable.

As the cycloalkyl group represented by $R_6$ and $R_7$, a cycloalkyl group having 6 to 12 carbon atoms is preferable, and a cycloalkyl group having 6 to 8 carbon atoms is more preferable.

The ring formed of $R_6$ and $R_7$ bonded to each other is a cyclic ether structure. The cyclic ether structure is preferably a 4- to 8-membered ring, and more preferably a 5- to 7-membered ring.

It is preferable that $R_6$ and $R_7$ satisfy a relationship in which the number of carbon atoms in the compound represented by Formula IV becomes equal to or greater than 6.

In Formula V, $R_8$ and $R_9$ each independently represent an alkyl group or a cycloalkyl group. Alternatively, $R_8$ and $R_9$ form a ring by being bonded to each other. L represents a single bond or an alkylene group.

As the alkyl group represented by $R_8$ and $R_9$, an alkyl group having 6 to 12 carbon atoms is preferable, and an alkyl group having 6 to 10 carbon atoms is more preferable.

As the cycloalkyl group represented by $R_8$ and $R_9$, a cycloalkyl group having 6 to 12 carbon atoms is preferable, and a cycloalkyl group having 6 to 10 carbon atoms is more preferable.

The ring formed of $R_8$ and $R_9$ bonded to each other is a cyclic diketone structure. The cyclic diketone structure is preferably a 6- to 12-membered ring, and more preferably a 6- to 10-membered ring.

As the alkylene group represented by L, for example, an alkylene group having 1 to 12 carbon atoms is preferable, and an alkylene group having 1 to 10 carbon atoms is more preferable.

$R_8$, $R_9$, and L satisfy a relationship in which the number of carbon atoms in the compound represented by Formula V becomes equal to or greater than 6.

Particularly, the content of the organic impurity having a boiling point equal to or higher than 250° C. with respect to the total mass of the chemical liquid is preferably equal to or greater than 0.001 mass ppm and less than 100 mass ppm.

The organic impurity having a boiling point equal to or higher than 250° C. means an organic substance having a boiling point equal to or higher than 250° C. among the organic impurities described above.

Examples of the organic impurity mixed into the chemical liquid in the manufacturing process of the chemical liquid include a resin component, a plasticizer, and the like contained in a plastic material (for example, an O-ring or the like) used in a member of a manufacturing device. As such components, for example, dioctyl phthalate (DOP, boiling point: 385° C.), di isononyl phthalate (DINP, boiling point: 403° C.), dioctyl adipate (DOA, boiling point: 335° C.), dibutyl phthalate (DBP, boiling point: 340° C.), ethylene propylene rubber (EPDM, boiling point: 300° C. to 450° C.), and the like have been confirmed.

In a case where the organic impurity having a boiling point equal to or higher than 250° C. contains an organic impurity having a boiling point equal to or higher than 270° C., the content of the organic impurity having a boiling point equal to or higher than 270° C. with respect to the total mass of the chemical liquid is preferably 0.001 to 60 mass ppm. In a case where the content of the organic impurity having a boiling point equal to or higher than 270° C. is within the above range of numerical values, the chemical liquid has further improved defect inhibition performance.

Furthermore, in a case where the organic impurity having a boiling point equal to or higher than 250° C. contains an organic impurity having a boiling point equal to or higher than 300° C., the content of the organic impurity having a boiling point equal to or higher than 300° C. with respect to the total mass of the chemical liquid is preferably 0.001 to 30 mass ppm. In a case where the content of the organic impurity having a boiling point equal to or higher than 300° C. is within the above range of numerical values, the chemical liquid has further improved defect inhibition performance.

In view of causing the chemical liquid to have further improved defect inhibition performance, the content of the organic impurity having a boiling point equal to or higher than 250° C. with respect to the total mass of the chemical liquid is more preferably 0.1 to 8 mass ppm.

The organic impurity having a boiling point equal to or higher than 250° C. is particularly preferably an organic impurity having 8 or more carbon atoms, and more preferably an organic impurity having 12 or more carbon atoms.

<Water>

It is preferable that the chemical liquid contains water. As the water, for example, distilled water, deionized water, pure water, and the like can be used without particular limitation.

The content of water in the chemical liquid is not particularly limited. Generally, the content of water with respect to the total mass of the chemical liquid is preferably 0.01% to 3.0% by mass, and more preferably 0.01% to 1.0% by mass.

In a case where the content of water in the chemical liquid is equal to or greater than 0.01% by mass, the chemical liquid has further improved defect inhibition performance. In a case where the content of water in the chemical liquid is equal to or smaller than 1.0% by mass, the chemical liquid has further improved defect inhibition performance.

Water may be added to the chemical liquid or may be unintentionally mixed into the chemical liquid in the manufacturing process of the chemical liquid. Examples of the case where water is unintentionally mixed into the chemical liquid in the manufacturing process of the chemical liquid include a case where water is contained in a raw material (for example, an organic solvent) used for manufacturing the chemical liquid, a case where water is mixed into the chemical liquid in the manufacturing process of the chemical liquid (for example, contamination), and the like. However, the present invention is not limited to these.

In the present specification, the content of water means a moisture content measured using a device which adopts the Karl Fischer moisture measurement method as the principle of measurement. The measurement method performed by the device is as described in Examples which will be described later.

[Physical Properties of Chemical Liquid]

The chemical liquid has the following physical properties.

(1) The charge potential is equal to or lower than 100 mV.

Furthermore, in view of obtaining a chemical liquid having further improved effects of the present invention, it is preferable that the chemical liquid has the following physical properties.

(2) The number of objects to be counted having a size of equal to or greater than 0.1 μm (hereinafter, referred to as "number of coarse particles" as well) that are counted by a light scattering-type liquid-borne particle counter is 1 to 100/mL.

Hereinafter, the physical properties (1) and (2) will be specifically described.

<Physical Property (1): Charge Potential is Equal to or Lower than 100 mV>

The charge potential of the chemical liquid is equal to or lower than 100 mV. The lower limit thereof is not particularly limited, but is preferably equal to or higher than 0.000001 mV in general. Furthermore, in view of causing the chemical liquid to have further improved effects of the present invention, the charge potential of the chemical liquid is more preferably 0.000001 to 50 mV.

In the present specification, the charge potential of the chemical liquid means a charge potential measured by the method based on Japanese Industrial Standards (JIS) C61340-2-2:2013 by using a non-contact type electrostatic potentiometer (for example, AS-20 manufactured by Achilles Corporation).

<Physical Property (2): Number of Coarse Particles is 1 to 100/mL>

In view of causing the chemical liquid to have further improved effects of the present invention, the number of objects to be counted (number of coarse particles) having a size equal to or greater than 0.1 μm that are counted by a light scattering-type liquid-borne particle counter is preferably 1 to 100/mL and more preferably 1 to 50/mL.

In a case where the number of coarse particles is equal to or greater than 1/mL, the chemical liquid has further improved defect inhibition performance. In a case where the number of coarse particles is equal to or smaller than 100/mL, the chemical liquid has further improved defect inhibition performance.

In the present specification, the objects to be counted having a size equal to or greater than 0.1 μm that are counted by a light scattering-type liquid-borne particle counter are referred to as "coarse particles" as well.

Examples of the coarse particles include particles of dirt, dust, organic solids, inorganic solids, and the like contained in a raw material (for example, an organic solvent) used for manufacturing the chemical liquid, dirt, dust, solids (formed of organic substances, inorganic substances, and/or metals) incorporated as contaminants into the chemical liquid while the chemical liquid is being prepared, and the like. However, the present invention is not limited to these.

The coarse particles also include a collodized impurity containing metal atoms. The metal atoms are not particularly limited. However, in a case where the content of at least one kind of metal atom selected from the group consisting of Na, K, Ca, Fe, Cu, Mg, Mn, Li, Al, Cr, Ni, Zn, and Pb (preferably Fe, Cr, Ni, and Pb) is particularly small (for example, in a case where the content of each of the aforementioned metal atoms in the organic solvent is equal to or smaller than 1,000 mass ppt), the impurity containing these metal atoms is easily colloidized.

[Manufacturing Method of Chemical Liquid]

As the manufacturing method of the chemical liquid, known manufacturing methods can be used without particular limitation. Particularly, in view of more simply obtaining the chemical liquid, a manufacturing method of a chemical liquid having the following steps in the following order is preferable. Hereinafter, each of the steps will be specifically described.

(1) Organic solvent preparation step of preparing organic solvent (2) Filtering step of passing substance to be purified containing organic solvent through filter so as to obtain chemical liquid <(1) Organic Solvent Preparation Step of Preparing Organic Solvent>

The organic solvent preparation step is a step of preparing an organic solvent. The method for preparing the organic solvent is not particularly limited, and examples thereof include methods such as preparing the organic solvent by purchase and obtaining the organic solvent as a reactant by reacting raw materials. As the organic solvent, it is preferable to prepare a substance in which the content of the aforementioned metal impurity containing metal atoms and/or the aforementioned organic impurity is small (for example, a substance in which the content of an organic solvent is equal to or greater than 99% by mass). Examples of commercial products of the organic solvent include those called "high-purity grade products".

As the method for obtaining the organic solvent as a reactant by reacting raw materials, known methods can be used without particular limitation. Examples thereof include a method for obtaining an organic solvent by reacting a single raw material or a plurality of raw materials in the presence of a catalyst.

More specifically, examples of the method include a method for obtaining butyl acetate by reacting acetic acid and n-butanol in the presence of sulfuric acid; a method for obtaining 1-hexanol by reacting ethylene, oxygen, and water in the presence of $Al(C_2H_5)_3$; a method for obtaining 4-methyl-2-pentanol by reacting cis-4-methyl-2-pentene in the presence of Diisopinocampheylborane (Ipc2BH); a method for obtaining propylene glycol 1-monomethyl ether 2-acetate (PGMEA) by reacting propylene oxide, methanol, and acetic acid in the presence of sulfuric acid; a method for obtaining isopropyl alcohol (IPA) by reacting acetone and hydrogen in the presence of copper oxide-zinc oxide-aluminum oxide; a method for obtaining ethyl lactate by reacting lactic acid and ethanol; and the like.

<(2) Filtering Step of Passing Substance to be Purified Containing Organic Solvent Through Filter so as to Obtain Chemical Liquid>

The filtering step is step of passing a substance to be purified containing the organic solvent through a filter so as to obtain a chemical liquid. In the present specification, the substance to be purified means, for example, a reactant obtained by the organic solvent preparation step, a purified substance obtained by a distillation step which will be described later, and an organic solvent prepared by means of purchase in the organic solvent preparation step.

The method for passing the substance to be purified through a filter is not particularly limited, and examples thereof include a method for disposing a filter unit comprising a filter and a filter housing in the middle of a transfer pipe line transferring the substance to be purified and passing the substance to be purified through the filter unit with or without applying pressure thereto.

In the filtering step, the temperature of the substance to be purified at the time when the substance to be purified passes through the filter is not particularly limited. However, the temperature is preferably 0° C. to 30° C. in general, and more preferably 0° C. to 15° C. Particularly, in view of more simply obtaining a chemical liquid having the effects of the present invention, it is more preferable that the filtering step satisfies a condition 1 and a condition 2 described below.

Condition 1: at the time when the substance to be purified passes through the filter, the temperature of the substance to be purified is lower than 23° C.

Condition 2: at the time when the substance to be purified passes through filter, the temperature of the substance to be purified satisfies Expression 1.

(Expression 1) temperature (° C.) of substance to be purified<flashing point (° C.) of organic solvent−5

As the method for controlling the temperature of the substance to be purified to be within the above range, known methods can be used without particular limitation.

In the present specification, the flashing point of the organic solvent means a flashing point measured based on JIS K 2265-2:2007.

In a case where the temperature of the substance to be purified at the time when the substance to be purified passes through the filter in the filtering step is 0° C. to 30° C., it is possible to inhibit the occurrence of charging (for example, charging by friction) between the chemical liquid and a contact member (for example, a filter, a filter housing, a pipe line, or the like) and to further inhibit the pipe line breakage.

As the temperature of the substance to be purified, a low temperature is particularly preferable, and in view of ease of manufacturing, a temperature equal to or higher than 0° C. is more preferable.

As the filter used in the filtering step, known filters can be used without particular limitation.

Examples of the material of the filter used in the filtering step include a fluororesin such as polytetrafluoroethylene (PTFE), a polyamide-based resin such as nylon, a polyolefin resin (including a polyolefin resin with high density and ultra-high molecular weight) such as polyethylene and polypropylene (PP), and the like. Among these, a polyamide-based resin, PTFE, and polypropylene (including high-density polypropylene) are preferable. In a case where filters formed of these materials are used, foreign substances with high polarity, which readily become the cause of a particle defect, can be more efficiently removed, and the amount of the metal impurity can be more efficiently reduced.

The lower limit of the critical surface tension of the filter is preferably equal to or higher than 70 mN/m. The upper limit thereof is preferably equal to or lower than 95 mN/m. The critical surface tension of the filter is more preferably equal to or higher than 75 mN/m and equal to or lower than 85 mN/m.

The value of the critical surface tension is the nominal value from manufacturers. In a case where a filter having critical surface tension within the above range is used, foreign substances with high polarity, which readily become the cause of a particle defect, can be efficiently removed, and the amount of the metal component (metal impurity) can be more efficiently reduced.

The pore size of the filter is preferably about 0.001 to 1.0 µm, more preferably about 0.01 to 0.5 and even more preferably about 0.01 to 0.1 µm. In a case where the pore size of the filter is within the above range, it is possible to inhibit the clogging of the filter and to reliably remove minute foreign substances contained in the substance to be purified.

At the time of using the filter, different filters may be combined. At this time, filtering carried out using a first filter may be performed once or performed two or more times. In a case where filtering is performed two or more times by using different filters in combination, the filters may be of the same type or different types, but it is preferable that the filters are of different types. Typically, it is preferable that at least one of the pore size or the constituent material varies between the first filter and the second filter.

It is preferable that the pore size for the second filtering and the next filtering is the same as or smaller than the pore size for the first filtering. Furthermore, first filters having different pore sizes within the above range may be combined. As the pore size mentioned herein, the nominal values form filter manufacturers can be referred to. A commercial filter can be selected from various filters provided from, for example, Pall Corporation Japan, Advantec Toyo Kaisha, Ltd., Nihon Entegris KK (former MICRONICS JAPAN CO., LTD.), KITZ MICRO FILTER CORPORATION, or the like. In addition, it is possible to use "P-NYLON FILTER (pore size: 0.02 µm, critical surface tension: 77 mN/m)" made of polyamide; (manufactured by Pall Corporation Japan), "PE-CLEAN FILTER (pore size: 0.02 µm)" made of high-density polyethylene; (manufactured by Pall Corporation Japan), and "PE•CLEAN FILTER (pore size: 0.01 µm)" made of high-density polyethylene; (manufactured by Pall Corporation Japan).

For example, from the viewpoint of allowing the chemical liquid according to the embodiment of the present invention to bring about desired effects and from the viewpoint of inhibiting the increase of the metal impurity (particularly, a metal impurity present in the chemical liquid as a solid) during the storage of the purified chemical liquid, provided that an interaction radius in the Hansen solubility parameter space (HSP) derived from the material of the filter used for filtering is R0, and that a radius of a sphere in the Hansen space derived from the organic solvent contained in the substance to be purified is Ra, it is preferable that the substance to be purified and the material of the filter used for filtering are combined such that the substance to be purified and the filter have a relationship satisfying a relational expression of (Ra/R0)≤1, and the substance to be purified is preferably filtered through a filter material satisfying the relational expression, although the combination of the substance to be purified and the filter is not particularly limited. Ra/R0 is preferably equal to or smaller than 0.98, and more preferably equal to or smaller than 0.95. The lower limit of Ra/R0 is preferably equal to or greater than 0.5, more preferably equal to or greater than 0.6, and even more preferably 0.7. In a case where Ra/R0 is within the above range, the increase in the content of the metal impurity in the chemical liquid during long-term storage is inhibited, although the mechanism is unclear.

The combination of the filter and the substance to be purified is not particularly limited, and examples thereof include those described in US2016/0089622.

As a second filter, a filter formed of the same material as the aforementioned first filter can be used. Furthermore, a filter having the same pore size as the aforementioned first filter can be used. In a case where a filter having a pore size smaller than that of the first filter is used as the second filter, a ratio between the pore size of the second filter and the pore size of the first filter (pore size of second filter/pore size of first filter) is preferably 0.01 to 0.99, more preferably 0.1 to 0.9, and even more preferably 0.2 to 0.9. In a case where the pore size of the second filter is within the above range, fine foreign substances intermixed with the solution are more reliably removed.

The filtering pressure affects the filtering accuracy. Therefore, it is preferable that the pulsation of pressure at the time of filtering is as low as possible.

In the manufacturing method of a chemical liquid, the filtering speed is not particularly limited. However, in view of obtaining a chemical liquid having further improved effects of the present invention, the filtering speed is preferably equal to or higher than 1.0 L/min/m$^2$, more preferably equal to or higher than 0.75 L/min/m$^2$, and even more preferably equal to or higher than 0.6 L/min/m$^2$.

For the filter, an endurable differential pressure for assuring the filter performance (assuring that the filter will not be broken) is set. In a case where the endurable differential pressure is high, by increasing the filtering pressure, the filtering speed can be increased. That is, it is preferable that the upper limit of the filtering speed is generally equal to or lower than 10.0 L/min/m$^2$ although the upper limit usually depends on the endurable differential pressure of the filter.

In the manufacturing method of a chemical liquid, in view of obtaining a chemical liquid having further improved effects of the present invention, the filtering pressure is preferably 0.001 to 1.0 MPa, more preferably 0.003 to 0.5 MPa, and even more preferably 0.005 to 0.3 MPa. Particularly, in a case where a filter having a small pore size is used, by increasing the filtering pressure, it is possible to efficiently reduce the amount of particle-like foreign substances or impurities dissolved in the substance to be purified. In a case where a filter having a pore size smaller than 20 nm is used, the filtering pressure is particularly preferably 0.005 to 0.3 MPa.

The smaller the pore size of the filtration filter, the lower the filtering speed. However, for example, in a case where a plurality of filtration filters of the same type are connected to each other in parallel, the filtering area is enlarged, and the filtering pressure is reduced. Therefore, in this way, the reduction in the filtering speed can be compensated.

It is more preferable that the filtering step includes the following steps. In the filtering step, each of the following steps may be performed once or plural times. Furthermore, the order of the following steps is not particularly limited.
1. Particle removing step
2. Metal ion removing step
3. Organic impurity removing step
4. Ion exchange step Hereinafter, each of the steps will be described.

Particle Removing Step

The particle removing step is a step of removing the coarse particles and/or the metal impurity (particularly, the metal impurity present as a solid in the chemical liquid) in the substance to be purified by using a particle removing filter. As the particle removing filter, known particle removing filters can be used without particular limitation.

Examples of the particle removing filter include a filter for removing particles having a diameter equal to or smaller than 20 nm. In a case where the organic solvent is filtered using the above filter, the coarse particles can be removed from the organic solvent (the aspect of the coarse particles is as described above).

The diameter of the particles to be removed is preferably 1 to 15 nm, and more preferably 1 to 12 nm. In a case where the diameter of the particles to be removed is equal to or smaller than 15 nm, finer coarse particles can be removed. In a case where the diameter of particles to be removed is equal to or greater than 1 nm, the filtering efficiency is improved.

The diameter of particles to be removed means the minimum size of particles that can be removed by the filter. For example, in a case where the diameter of particles to be removed by the filter is 20 nm, the filter can remove particles having a diameter equal to or greater than 20 nm.

Examples of the material of the aforementioned filter include 6-nylon, 6,6-nylon, polyethylene, polypropylene, polystyrene, polyimide, polyamide imide, a fluororesin, and the like.

The polyimide and/or polyamide imide may have at least one group selected from the group consisting of a carboxy group, a salt-type carboxy group, and a —NH— bond. A fluororesin, polyimide and/or polyamide imide have excellent solvent resistance.

A filter unit may be constituted with a plurality of filters described above. That is, the filter unit may further comprise a filter for removing particles having a diameter equal to or greater than 50 nm (for example, a microfiltration membrane for removing fine particles having a pore size equal to or greater than 50 nm). In a case where fine particles are present in the substance to be purified in addition to the colloidized impurity, particularly, the colloidized impurity containing metal atoms such as iron or aluminum, by filtering the substance to be purified by using a filter for removing particles having a diameter equal to or greater than 50 nm (for example, a microfiltration membrane for removing fine particles having a pore size equal to or greater than 50 nm) before filtering the substance to be purified by using a filter for removing particles having a diameter equal to or smaller than 20 nm (for example, a microfiltration membrane having a pore size equal to or smaller than 20 nm), the filtering efficiency of the filter for removing particles having a diameter equal to or smaller than 20 nm (for example, a microfiltration membrane having a pore size equal to or smaller than 20 nm) is improved, and the coarse particle removing performance is further improved.

Metal Ion Removing Step

It is preferable that the filtering step further includes a metal ion removing step.

As the metal ion removing step, a step of passing the substance to be purified through a metal ion adsorption filter is preferable. The method for passing the substance to be purified through the metal ion adsorption filter is not particularly limited, and examples thereof include a method for disposing a metal ion adsorption filter unit comprising a metal ion adsorption filter and a filter housing in the middle of a transfer pipe line transferring the substance to be purified and passing the substance to be purified through the metal ion adsorption filter unit with or without applying pressure thereto.

The metal ion adsorption filter is not particularly limited, and examples thereof include known metal ion adsorption filters.

The metal ion adsorption filter is preferably a filter which can perform ion exchange. Herein, the metal ions to be adsorbed are not particularly limited. However, at least one kind of metal ion selected from the group consisting of Fe, Cr, Ni, and Pb is preferable, and all the metal ions of Fe, Cr, Ni, and Pb are preferable, because these readily become the cause of a defect in a semiconductor device.

From the viewpoint of improving the metal ion adsorption performance, it is preferable that the metal ion adsorption filter has an acid group on the surface thereof. Examples of the acid group include a sulfo group, a carboxy group, and the like.

Examples of the base material (material) constituting the metal ion adsorption filter include cellulose, diatomite, nylon, polyethylene, polypropylene, polystyrene, a fluororesin, and the like.

The metal ion adsorption filter may be constituted with material including polyimide and/or polyamide imide. Examples of the metal ion adsorption filter include the polyimide and/or polyamide imide porous membrane described in JP2016-155121A.

The polyimide and/or polyamide imide porous membrane may contain at least one group selected from the group consisting of a carboxy group, a salt-type carboxy group, and a —NH— bond. In a case where the metal ion adsorption filter is formed of a fluororesin, polyimide, and/or polyamide imide, the filter has further improved solvent resistance.

Organic Impurity Removing Step

It is preferable that the filtering step includes an organic impurity removing step. As the organic impurity removing step, a step of passing the substance to be purified through an organic impurity adsorption filter is preferable. The method for passing the substance to be purified through the organic impurity adsorption filter is not particularly limited, and examples thereof include a method for disposing a filter unit comprising an organic impurity adsorption filter and a filter housing in the middle of a transfer pipe line transferring the substance to be purified and passing the organic solvent through the filter unit with or without applying pressure thereto.

The organic impurity adsorption filter is not particularly limited, and examples thereof include known organic impurity adsorption filters.

In view of improving the organic impurity adsorption performance, it is preferable that the organic impurity adsorption filter has the skeleton of an organic substance, which can interact with the organic impurity, on the surface thereof (in other words, it is preferable that the surface of the organic impurity adsorption filter is modified with the skeleton of an organic substance which can interact with the organic impurity). Examples of the skeleton of an organic substance which can interact with the organic impurity include a chemical structure which can react with the organic impurity so as to make the organic impurity trapped in the organic impurity adsorption filter. More specifically, in a case where the organic impurity contains long-chain n-alkyl alcohol (structural isomer in a case where long-chain 1-alkyl alcohol is used as an organic solvent), examples of the skeleton of an organic substance include an alkyl group. Furthermore, in a case where the organic impurity includes dibutylhydroxytoluene (BHT), examples of the skeleton of an organic substance include a phenyl group.

Examples of the base material (material) constituting the organic impurity adsorption filter include cellulose supporting active carbon, diatomite, nylon, polyethylene, polypropylene, polystyrene, a fluororesin, and the like.

Furthermore, as the organic impurity adsorption filter, it is possible to use the filters obtained by fixing active carbon to non-woven cloth that are described in JP2002-273123A and JP2013-150979A.

For the organic impurity adsorption filter, in addition to the chemical adsorption described above (adsorption using the organic impurity removing filter having the skeleton of an organic substance, which can interact with the organic impurity, on the surface thereof), a physical adsorption method can be used.

For example, in a case where the organic impurity contains BHT, the structure of BHT is larger than 10 Å (=1 nm). Accordingly, in a case where an organic impurity adsorption filter having a pore size of 1 nm is used, BHT cannot pass through the pore of the filter. That is, by being physically trapped by the filter, BHT is removed from the substance to be purified. In this way, for removing an organic impurity, not only a chemical interaction but also a physical removing method can be used. Here, in this case, a filter having a pore size equal to or greater than 3 nm is used as "particle removing filter", and a filter having a pore size less than 3 nm is used as "organic impurity adsorption filter".

In the present specification, 1 Å (angstrom) equals 0.1 nm.

Ion Exchange Step

The filtering step may further include an ion exchange step.

As the ion exchange step, a step of passing the substance to be purified through an ion exchange unit is preferable. The method for passing the substance to be purified through the ion exchange unit is not particularly limited, and examples thereof include a method for disposing an ion exchange unit in the middle of a transfer pipe line transferring the substance to be purified and passing the organic solvent through the ion exchange unit with or without applying pressure thereto.

As the ion exchange unit, known ion exchange units can be used without particular limitation. Examples of the ion exchange unit include an ion exchange unit including a tower-like container storing an ion exchange resin, an ion adsorption membrane, and the like.

Examples of an aspect of the ion exchange step include a step in which a cation exchange resin or an anion exchange resin provided as a single bed is used as an ion exchange resin, a step in which a cation exchange resin and an anion exchange resin provided as a dual bed are used as an ion exchange resin, and a step in which a cation exchange resin and an anion exchange resin provided as a mixed bed are used as an ion exchange resin.

In order to reduce the amount of moisture eluted from the ion exchange resin, as the ion exchange resin, it is preferable to use a dry resin which does not contain moisture as far as possible. As the dry resin, commercial products can be used, and examples thereof include 15JS-HG•DRY (trade name, dry cation exchange resin, moisture: equal to or smaller than 2%) and MSPS2-1•DRY (trade name, mixed bed resin, moisture: equal to or smaller than 10%) manufactured by ORGANO CORPORATION, and the like.

It is preferable that the ion exchange step is performed before the distillation step described above or before a moisture adjustment step which will be described later.

As another aspect of the ion exchange step, a step of using an ion adsorption membrane can be exemplified.

In a case where the ion adsorption membrane is used, a treatment can be performed at a high flow rate. The ion adsorption membrane is not particularly limited, and examples thereof include NEOSEPTA (trade name, manufactured by ASTOM Corporation), and the like.

It is preferable that the ion exchange step is performed after the distillation step described above. In a case where the ion exchange step is performed, it is possible to remove the impurities accumulated in the purification device in a case where the impurities leak or to remove substances eluted from a pipe line made of stainless steel (SUS) or the like used as a transfer pipe line.

<(3) Optional Step>

The manufacturing method of a chemical liquid may include a distillation step, a moisture adjustment step, an electricity removing step, and the like as optional steps in addition to the steps described above. Hereinafter, the optional steps will be specifically described.

(Distillation Step)

The manufacturing method of a chemical liquid may include a distillation step. The distillation step means a step of distilling the organic solvent or the reactant so as to obtain a purified substance. As the distillation method, known methods can be used without particular limitation.

In a case where the manufacturing method of a chemical liquid includes the distillation step, the order of the steps described above and the distillation step is not particularly limited. However, in view of being capable of more simply obtaining the chemical liquid, it is preferable that the distillation step is performed before the filtering step, after the organic solvent preparation step.

Furthermore, in view of being capable of more simply obtaining the purified substance and making it more difficult for unintended impurities to be mixed into the purified substance in the distillation step, it is more preferable that the organic solvent or the reactant is distilled using the following purification device.

Purification Device

As an aspect of the purification device which can be used in the distillation step, for example, a purification device can be exemplified which has a distillation column for obtaining a purified substance by distilling the organic solvent, in which a liquid contact portion (for example, an inner wall, a pipe line, or the like) of the distillation column is formed of at least one kind of material selected from the group consisting of a nonmetallic material and an electropolished metallic material.

As the nonmetallic material, known materials can be used without particular limitation.

Examples of the nonmetallic material include at least one kind of material selected from the group consisting of a polyethylene resin, a polypropylene resin, a polyethylene-polypropylene resin, polytetrafluoroethylene, a tetrafluoroethylene-perfluoroalkyl vinyl ether copolymer, a tetrafluoroethylene-hexafluoropropylene copolymer resin, a tetrafluoroethylene-ethylene copolymer resin, a chlorotrifluoro ethylene-ethylene copolymer resin, a vinylidene fluoride resin, a chlorotrifluoroethylene copolymer resin, and a vinyl fluoride resin. However, the present invention is not limited to these.

As the metallic material, known materials can be used without particular limitation.

Examples of the metallic material include a metallic material in which the total content of chromium and nickel with respect to the total mass of the metallic material is greater than 25% by mass. The total content of chromium and nickel is more preferably equal to or greater than 30% by mass. The upper limit of the total content of chromium and nickel in the metallic material is not particularly limited, but is preferably equal to or smaller than 90% by mass in general.

Examples of the metallic material include stainless steel, a nickel-chromium alloy, and the like.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass with respect to the total mass of the metallic material.

Examples of the nickel-chromium alloy include HASTELLOY (tradename, the same is true for the following description), MONEL (tradename, the same is true for the following description), INCONEL (tradename, the same is true for the following description), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs [0011] to [0014] in JP2015-227501A, paragraphs [0036] to [0042] in JP2008-264929A, and the like.

Presumably, in a case where the metallic material is electropolished, the chromium content in a passive layer on the surface thereof may become higher than the chromium content in the parent phase. For this reason, from the distillation column in which the liquid contact portion is formed of an electropolished metallic material, the metal impurity containing metal atoms may not easily flow into the organic solvent, and hence a distilled organic solvent with a reduced impurity content can be obtained.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

Purification Device (Another Aspect)

As another aspect of the purification device which can be used in the distillation step, a purification device can be exemplified which comprises a reaction portion for obtaining an organic solvent, which is a reactant, by reacting raw materials, the distillation column described above, and a transfer pipe line which connects the reaction portion and the distillation column to each other so as to transfer the reactant to the distillation column from the reaction portion.

The reaction portion has a function of obtaining an organic solvent, which is a reactant, by reacting the supplied raw materials (if necessary, in the presence of a catalyst). As the reaction portion, known reaction portions can be used without particular limitation.

Examples of the reaction portion include an aspect comprising a reactor to which raw materials are supplied and in which a reaction proceeds, a stirring portion provided in the interior of the reactor, a lid portion joined to the reactor, an injection portion for injecting the raw materials into the reactor, and a reactant outlet portion for taking the reactant out of the reactor. By continuously or non-continuously injecting the raw materials into the reaction portion and reacting the injected raw materials (in the presence of a catalyst), an organic solvent, which is a reactant, can be obtained.

If desired, the reaction portion may also include a reactant isolation portion, a temperature adjustment portion, a sensor portion including a level gauge, a manometer, and a thermometer, and the like.

It is preferable that the liquid contact portion (for example, the interior wall of the liquid contact portion of the reactor, or the like) of the reaction portion is formed of at least one kind of material selected from the group consisting of a nonmetallic material and an electropolished metallic material. The aspect of each of the aforementioned materials is as described above.

In a case where the purification device including the reaction portion is used, a purified substance with a further reduced impurity content is obtained.

In the purification device according to the above aspect, the reaction portion and the distillation column are connected to each other through the transfer pipe line. Because the reaction portion and the distillation column are connected to each other through the transfer pipe line, the transfer of the reactant to the distillation column from the reaction portion is carried out in a closed system, and impurities including a metal impurity are inhibited from being mixed into the reactant from the environment. Accordingly, a purified substance with a further reduced impurity content can be obtained.

As the transfer pipe line, known transfer pipe lines can be used without particular limitation. As the transfer pipe line, an aspect comprising a pipe, a pump, a valve, and the like can be exemplified.

It is preferable that the liquid contact portion of the transfer pipe line is formed of at least one kind of material selected from the group consisting of a nonmetallic material and an electropolished metallic material. The aspect of each of the aforementioned materials is as described above.

In a case where the purification device comprising the transfer pipe line is used, it is possible to more simply obtain a purified substance with a further reduced impurity content.

Moisture Adjustment Step

The moisture adjustment step is a step of adjusting the content of water contained in the substance to be purified. The method for adjusting the content of water is not particularly limited, and examples thereof include method for adding water to the substance to be purified and a method for removing water from the substance to be purified.

As the method for removing water, known dehydration methods can be used without particular limitation.

Examples of the method for removing water include a dehydration membrane, a water adsorbent insoluble in an organic solvent, an aeration purging device using dried inert gas, a heating device, a vacuum heating device, and the like.

In a case where the dehydration membrane is used, membrane dehydration by pervaporation (PV) or vapor permeation (VP) is performed. The dehydration membrane is constituted as a permeable membrane module, for example. As the dehydration membrane, it is possible to use a membrane formed of a polymeric material such as a polyimide-based material, a cellulose-based material, and a polyvinyl alcohol-based material or an inorganic material such as zeolite.

The water adsorbent is used by being added to the substance to be purified. Examples of the water adsorbent include zeolite, diphosphorus pentoxide, silica gel, calcium chloride, sodium sulfate, magnesium sulfate, anhydrous zinc chloride, fuming sulfuric acid, soda lime, and the like.

In a case where zeolite (particularly, MOLECULAR SIEVE (trade name) manufactured by Union Showa K. K.) is used in the dehydration treatment, olefins can also be removed.

(Electricity Removing Step)

The electricity removing step is a step of removing electricity from the substance to be purified such that the charge potential of the substance to be purified is reduced.

As the electricity removing method, known electricity removing methods can be used without particular limitation. Examples of the electricity removing method include a method for bringing the substance to be purified into contact with a conductive material.

The contact time for which the substance to be purified is brought into contact with a conductive material is preferably 0.001 to 60 seconds, more preferably 0.001 to 1 second, and even more preferably 0.01 to 0.1 seconds. Examples of the conductive material include stainless steel, gold, platinum, diamond, glassy carbon, and the like.

Examples of the method for bringing the substance to be purified into contact with a conductive material include a method for disposing a grounded mesh formed of a conductive material in the interior of a pipe line and passing the substance to be purified through the mesh, and the like.

It is preferable that the electricity removing step is performed before at least one step selected from the group consisting of the organic solvent preparation step, the distillation step, and the filtering step.

Each of the steps described above is preferably performed under a sealed condition in an inert gas atmosphere in which water is less likely to be mixed into the substance to be purified.

Furthermore, in order to inhibit the intermixing of moisture as much as possible, each of the steps is preferably performed in an inert gas atmosphere in which a dew-point temperature is equal to or lower than −70° C. This is because in the inert gas atmosphere at a temperature equal to or lower than −70° C., the concentration of moisture in a gas phase is equal to or lower than 2 mass ppm, and hence the likelihood that moisture will be mixed into the substance to be purified is reduced.

The manufacturing method of a chemical liquid may include, in addition to the above steps, the adsorptive purification treatment step for metal components using silicon carbide described in WO2012/043496A.

In the manufacturing method of a chemical liquid, portions in the device relating to the manufacturing that contact the chemical liquid are preferably washed before the manufacturing of the chemical liquid according to the embodiment of the present invention. The liquid used for washing is not particularly limited, but is preferably the chemical liquid itself, a liquid obtained by diluting the chemical liquid, or the like. Alternatively, it is possible to use an organic solvent which substantially does not contain the particles containing metal atoms, the metal ion component, and the organic impurity or to use an organic solvent in which the content of these is sufficiently reduced. The washing may be performed plural times. Furthermore, two or more kinds of organic solvents may be used, or a mixture of two or more kinds of organic solvents may be used. The washing may be circulation washing. Whether the device relating to the manufacturing is sufficiently washed can be judged by measuring the content of the particles containing metal atoms, the metal ion component, and the organic impurity contained in the liquid used for washing.

[Use of Chemical Liquid]

The use of the chemical liquid is not particularly limited.

Regarding the use of the chemical liquid, it is preferable that the chemical liquid is used in a semiconductor device manufacturing process. The chemical liquid can be used in any step for manufacturing a semiconductor device. Specifically, examples of the use of the chemical liquid include a prewet solution with which a substrate is coated before a step of forming a resist film by using a photoresist composition so as to ameliorate the coating properties of the composition, a developer for developing an exposed resist film formed of a photoresist composition, and a rinse solution for washing a developed film. Furthermore, the chemical liquid can be used as a diluent of resist materials contained in a photoresist composition.

Furthermore, the chemical liquid can be used for washing a portion (liquid contact portion), which contact the chemical liquid, in the device used for manufacturing a semiconductor device. In a case where the liquid contact portion of the device used for manufacturing a semiconductor device is washed with the chemical liquid (or a diluted substance thereof), it is possible to remove impurities (the metal impurity, the organic impurity, and the like), which cause a defect on a semiconductor substrate, from the liquid contact portion.

Furthermore, the chemical liquid can be suitably used for uses other than the manufacturing of a semiconductor. The chemical liquid can be used as a developer and/or rinse solution for polyimide, a resist for a sensor, a resist for a lens, and the like.

In addition, the chemical liquid can be used as a solvent for medical uses or for washing. Particularly, the chemical liquid can be suitably used for washing a container, a pipe line, or a substrate (for example, a wafer, glass, or the like).

<Container>

The chemical liquid may be temporarily stored in a container until the chemical liquid is used. As the container for storing the chemical liquid, known containers can be used without particular limitation.

As the container storing the chemical liquid, a container for a semiconductor is preferable which has a high internal cleanliness and hardly causes elution of impurities.

Examples of the usable container specifically include a "CLEAN BOTTLE" series manufactured by AICELLO CORPORATION, "PURE BOTTLE" manufactured by KODAMA PLASTICS Co., Ltd., and the like, but the container is not limited to these.

It is preferable that the liquid contact portion of the container is formed of a nonmetallic material.

Examples of the nonmetallic material include the materials exemplified above as nonmetallic materials used in the liquid contact portion of the distillation column.

Particularly, in a case where a container in which the liquid contact portion is formed of a fluororesin among the above materials is used, the occurrence of a problem such as elution of an ethylene or propylene oligomer can be further inhibited than in a case where a container in which the liquid contact portion is formed of a polyethylene resin, a polypropylene resin, or a polyethylene-polypropylene resin is used.

Specific examples of the container in which the liquid contact portion is formed of a fluororesin include FluoroPure PFA composite drum manufactured by Entegris, Inc., and the like. Furthermore, it is possible to use the containers described on p. 4 in JP1991-502677A (JP-H03-502677A), p. 3 in WO2004/016526A, p. 9 and p. 16 in WO99/046309A, and the like. In a case where the nonmetallic material is used for the liquid contact portion, it is preferable to inhibit the elution of the nonmetallic material into the chemical liquid.

Regarding the container, the liquid contact portion contacting the chemical liquid is preferably formed of a metallic material containing a Cr atom and an Fe atom, and the metallic material is preferably at least one kind of material selected from the group consisting of stainless steel and electropolished stainless steel.

In a case where the container stores the chemical liquid, it is more difficult for the metal impurity and/or the organic impurity to be eluted into the chemical liquid stored in the container.

The aspect of the stainless steel is as described above as the material of the liquid contact portion of the distillation column. The aspect of the electropolished stainless steel is as described above as well.

The mass ratio (hereinafter, referred to as "Cr/Fe" as well) of the content of the Cr atom to the content of the Fe atom in the metallic material forming the liquid contact portion of the container is not particularly limited, but is preferably 0.5 to 4 in general. Particularly, in view of making it more difficult for the metal impurity and/or the organic impurity to be eluted into the chemical liquid stored in the container, Cr/Fe is more preferably higher than 0.5 and less than 3.5. In a case where Cr/Fe is higher than 0.5, it is possible to inhibit metals from being eluted from the interior of the container. In a case where Cr/Fe is less than 3.5, internal peeling of the container that causes particles and the like hardly occur.

The method for adjusting Cr/Fe in the metallic material is not particularly limited, and examples thereof include a method for adjusting the content of the Cr atom in the metallic material, a method for performing electropolishing such that the content of chromium in a passive layer on the electropolished surface becomes greater than the content of chromium in a parent phase, and the like.

It is preferable that the interior of the aforementioned container is washed before the solution is stored into the container. As a liquid used for washing, the chemical liquid itself or a liquid obtained by diluting the chemical liquid is preferable. After being manufactured, the chemical liquid may be bottled using a container such as a gallon bottle or a quart bottle, transported, and stored. The gallon bottle may be formed of a glass material or other materials.

In order to prevent the change of the components in the solution during storage, purging may be performed in the interior of the container by using an inert gas (nitrogen, argon, or the like) having a purity equal to or higher than 99.99995% by volume. Particularly, a gas with small moisture content is preferable. The temperature at the time of transport and storage may be room temperature. However, in order to prevent alteration, the temperature may be controlled within a range of −20° C. to 30° C.

(Clean Room)

It is preferable that all of the manufacturing of the chemical liquid, the opening and/or washing of the container, the handling including storage of the solution, the treatment and analysis, and the measurement are performed in a clean room. It is preferable that the clean room meets the 14644-1 clean room standard. The clean room preferably meets any of International Organization for Standardization (ISO) class 1, ISO class 2, ISO class 3, or ISO class 4, more preferably meets ISO class 1 or ISO class 2, and even more preferably meets ISO class 1.

[Chemical Liquid Storage Body]

The chemical liquid storage body according to the embodiment of the present invention comprises a container and a chemical liquid stored in the container, in which a liquid contact portion, which contacts the chemical liquid, in the container is formed of a metallic material containing a Cr atom and an Fe atom, and the metallic material is at least one kind of material selected from the group consisting of stainless steel and electropolished stainless steel.

The aspect of the container is as described above as the suitable aspect of the container which can store the chemical liquid.

[Manufacturing Method of Chemical Liquid Storage Body]

As the manufacturing method of a chemical liquid storage body, known manufacturing methods can be used without particular limitation. Particularly, in view of being capable of more simply obtaining the chemical liquid storage body, a manufacturing method of a chemical liquid including the following steps performed in the following order is preferable. Hereinafter, each of the steps will be specifically described.

(1) Organic solvent preparation step of preparing organic solvent
(2) Filtering step of passing substance to be purified containing organic solvent through filter so as to obtain chemical liquid
(3) Storing step of storing chemical liquid in container so as to obtain chemical liquid storage body <(1) Organic Solvent Preparation Step of Preparing Organic Solvent>

It is preferable that the manufacturing method of a chemical liquid storage body includes an organic solvent preparation step. The aspect of the organic solvent preparation step is as described above as the aspect of the manufacturing method of a chemical liquid.

<(2) Filtering Step of Passing Substance to be Purified Containing Organic Solvent Through Filter so as to Obtain Chemical Liquid>

It is preferable that the manufacturing method of a chemical liquid storage body includes a filtering step. The aspect of the filtering step is as described above as the aspect of the manufacturing method of a chemical liquid.

<(3) Storing Step of Storing Chemical Liquid in Container so as to Obtain Chemical Liquid Storage Body>

It is preferable that the manufacturing method of a chemical liquid storage body includes a storing step. As the method for storing the chemical liquid in a container, known storage methods can be used without particular limitation.

The aspect of the container is as described above as the aspect of the container that the chemical liquid storage body comprises.

In the storing step, the temperature of the chemical liquid at the time when the chemical liquid is stored in a container is not particularly limited. However, generally, the temperature is preferably 0° C. to 30° C., and more preferably 0° C. to 10° C. Particularly, in view of more simply obtaining a chemical liquid having the effects of the present invention, it is more preferable that the chemical liquid storing step satisfies a condition A and a condition B described below.

Condition A: at the time when the chemical liquid is stored in a container, the temperature of the chemical liquid is lower than 23° C.

Condition B: at the time when the chemical liquid is stored in a container, the temperature of the chemical liquid satisfies Expression 2.

(Expression 2) temperature (° C.) of chemical liquid<flashing point (° C.) of organic solvent−5

As the method for controlling the temperature of the chemical liquid to be within the above range, known methods can be used without particular limitation.

In a case where the temperature of the chemical liquid at the time when the chemical liquid is stored in a container in the storing step is 0° C. to 30° C., it is possible to inhibit the occurrence of charging (for example, charging by friction) between the chemical liquid and a contact member (for example, a pipe line or the like) and to further inhibit the pipe line breakage. As the temperature of the substance to be purified, a low temperature is particularly preferable, and in view of ease of manufacturing, a temperature equal to or higher than 0° C. is more preferable.

As the method for storing the chemical liquid in a container, in view of being capable of more simply obtaining the chemical liquid storage body and making it more difficult for unintended impurities to be mixed into the chemical liquid in the chemical liquid storing step, a method for storing the chemical liquid in a container by using the following storage device is more preferable.

Storage Device

As an aspect of the storage device which can be used in the chemical liquid storing step, a storage device can be exemplified which includes a chemical liquid storage portion, in which a liquid contact portion of the chemical liquid storage portion is formed of at least one kind of material selected from the group consisting of a nonmetallic material and an electropolished metallic material.

The aspects of the nonmetallic material and the electropolished metallic material are as described above as the materials of the liquid contact portion of the distillation device.

Storage Device (Another Aspect)

As another aspect of the storage device which can be used in the chemical liquid storing step, a storage device can be exemplified which comprises a chemical liquid storage portion and a chemical liquid supply pipe line which is connected to the chemical liquid storage portion so as to supply the chemical liquid to a chemical liquid supply portion, in which a liquid contact portion of the chemical liquid supply pipe line is formed of at least one kind of material selected from the group consisting of a nonmetallic material and an electropolished metallic material.

The aspects of the nonmetallic material and the electropolished metallic material are as described above as the materials of the liquid contact portion of the distillation device.

The storage device according to the present aspect comprises the chemical liquid supply pipe line connected to the chemical liquid storage portion. The chemical liquid supply pipe line is connected to the pipe line transferring the substance to be purified used in the filtering step. Therefore, the transfer of the chemical liquid, which is obtained by the filtering step, to the chemical liquid storage portion is carried out in a closed system. Accordingly, it is possible to inhibit the metal impurity and/or the organic impurity from being mixed into the chemical liquid.

<Suitable Aspect of Manufacturing Method of Chemical Liquid Storage Body>

It is more preferable that the manufacturing method of a chemical liquid storage body includes the following steps.

(1) Organic solvent preparation step of preparing organic solvent (2) Filtering step of passing substance to be purified containing organic solvent through filter so as to obtain chemical liquid (3) Storing step of storing chemical liquid in container so as to obtain chemical liquid storage body Herein, (2) filtering step and (3) storing step satisfy a condition 3 and a condition 4 described below.

Condition 3: at the time when the substance to be purified passes through a filter, the temperature of the substance to be purified is lower than 23° C., and at the time when the chemical liquid is stored in a container, the temperature of the chemical liquid is lower than 23° C.

Condition 4: at the time when the substance to be purified passes through a filter, the temperature of the substance to be purified satisfies Expression 1, and at the time when the chemical liquid is stored in a container, the temperature of the chemical liquid satisfies Expression 2.

(Expression 1) temperature of substance to be purified<flashing point of organic solvent−5

(Expression 2) temperature of chemical liquid<flashing point of organic solvent−5

In Expression 1 and Expression 2, the unit of the temperature of the substance to be purified, the temperature of the chemical liquid, and the flashing point of the organic solvent is ° C.

The aspects of the organic solvent preparation step and the filtering step are as described above as the aspect of the manufacturing method of a chemical liquid. Furthermore, the aspect of the storing step is as described above as the aspect of the manufacturing method of a chemical liquid storage body.

According to the manufacturing method of a chemical liquid storage body, the chemical liquid storage body can be more simply manufactured.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

In order to manufacture chemical liquids and chemical liquid storage bodies of examples and comparative examples, the following organic solvents were prepared. As each of the organic solvents, a high-purity grade organic solvent having purity equal to or higher than 99% by mass was used. The abbreviation for each of the organic solvents and the flashing point of each of the organic solvents measured based on JIS K 2265-2:2007 are shown in the bracket.

Butyl acetate (nBA, flashing point: 28° C.)
Propylene glycol monomethyl ether (PGME, flashing point: 32° C.)
Propylene glycol monoethyl ether (PGEE, flashing point: 38° C.)
Propylene glycol monopropyl ether (PGPE, flashing point: 48° C.)
Ethyl lactate (EL, flashing point: 53° C.)
Cyclopentanone (CyPe, flashing point: 34° C.)
Cyclohexanone (CyHe, flashing point: 44° C.)
Propylene glycol monomethyl ether acetate (PGMEA, flashing point: 42° C.)
4-Methyl-2-pentanol (MIBC, flashing point: 43° C.)

As an organic solvent, butyl acetate (nBA) was prepared, and a chemical liquid 1 was manufactured by the following method.

The chemical liquid 1 was manufactured using a device in which a stainless steel tank having a liquid contact portion formed of electropolished stainless steel and a plurality of filter units were connected to each other through a circulating transfer pipe line (circulation pipe line). Furthermore, the circulation pipe line comprises a pump in the middle of the pipe line. The liquid contact portion of the circulation pipe line was formed of polytetrafluoroethylene (PTFE). Furthermore, filters disposed in the following order from the tank side were used.

The temperature of the organic solvent (hereinafter, referred to as "filtering temperature") at the time when the organic solvent passes through the filter was 20° C.

First metal ion adsorption filter (15 nm IEX PTFE manufactured by Entegris, Inc. (filter made of PTFE having a pore size of 15 nm including a base material having a sulfo group on the surface thereof))

Particle removing filter (12 nm PTFE manufactured by Entegris, Inc. (filter made of PTFE for removing particles having a diameter of 12 nm))

Organic impurity adsorption filter (special filter A (filter described in JP2013-150979A obtained by fixing active carbon to non-woven cloth))

Furthermore, the downstream side of the organic impurity adsorption filter was provided with moisture adjustment means containing MOLECULAR SIEVE 3A (manufactured by Union Showa K. K., dehydrating agent).

Butyl acetate (nBA) was filled into the tank and then circulated 10 times through the pipe line including the filter and the moisture adjustment means described above, thereby obtaining the chemical liquid 1.

By using a storage device comprising a chemical liquid storage portion and a chemical liquid supply pipe line connecting the aforementioned tank and the chemical liquid storage portion to each other, the obtained chemical liquid 1 was stored in a container, thereby obtaining a chemical liquid storage body 1. The temperature of the chemical liquid (hereinafter, referred to as "storage temperature") at the time when the chemical liquid was stored in the container was 20° C.

The liquid contact portion of the chemical liquid storage device was formed of polytetrafluoroethylene (PTFE).

Furthermore, the liquid contact portion of the container was formed of electropolished stainless steel. The mass ratio of the content of a Cr atom to the content of an Fe atom in the metallic material (stainless steel) of the liquid contact portion was 2.8.

Examples 2 to 40 and Comparative Examples 1 to 4

Chemical liquids were prepared in the same manner as in Example 1, except that the organic solvents and the containers described in Table 1 were used, and the filtering temperature and the storage temperature were set as described in Table 1. Each of the chemical liquids was stored in a container. The composition of each of the chemical liquids described in Table 1 was adjusted by changing the material used, the number of times the chemical liquid passed through the filter, presence or absence of the filter, and the like.

For preparing the chemical liquids of Examples 3 and 13 to 18, the organic impurity adsorption filter was not used.

For preparing the chemical liquids of Examples 25 to 27, MOLECULAR SIEVE 3A was not used.

For preparing the chemical liquids of Examples 28 to 30 and Comparative Example 2, the particle removing filter was not used.

[Method for Measuring Content of Each Component Contained in Chemical Liquid, and the Like]

For measuring the content of each component contained in the chemical liquid which was prepared in each of the examples and the comparative example and stored in a container, and the like, the following method was used. All of the following measurements were performed in a clean room that met the level equal to or lower than International Organization for Standardization (ISO) Class 2. In order to improve the measurement accuracy, at the time of measuring each component, in a case where the content of the component was found to be equal to or smaller than a detection limit by general measurement, the organic solvent was concentrated by $1/100$ in terms of volume for performing the measurement, and the content was calculated by converting the concentration into the content of the organic solvent not yet being concentrated. The results are summarized in Table 1 and Table 2.

<Content of Organic Solvent and Organic Impurity>

The content of the organic solvent and the organic impurity contained in the chemical liquid which was prepared in each of the examples and the comparative examples and stored in a container was measured using a gas chromatography mass spectrometer (tradename "GCMS-2020", manufactured by Shimadzu Corporation).

(Measurement Condition)
Capillary column: InertCap 5MS/NP 0.25 mmI.D.×30 m df=0.25 μm
Sample introduction method: slit 75 kPa constant pressure
Vaporizing chamber temperature: 230° C.
Column oven temperature: 80° C. (2 min)–500° C. (13 min) heating rate 15° C./min
Carrier gas: helium
Septum purge flow rate: 5 mL/min
Split ratio: 25:1
Interface temperature: 250° C.
Ion source temperature: 200° C.
Measurement mode: Scan
Amount of sample introduced: 1 μL <Content of Metal Ion and Particles>

The content of the metal ion and the particles (particles containing metal atoms) contained in the chemical liquid which was prepared in each of the examples and the comparative examples and stored in a container was measured using Agilent 8800 triple quadrupole ICP-MS (for semiconductor analysis, option #200).

(Measurement Condition)
As a sample introduction system, a quartz torch, a coaxial perfluoroalkoxyalkane (PFA) nebulizer (for self-suction), and a platinum interface cone were used. The measurement parameters of cool plasma conditions are as below.
Output of Radio Frequency (RF) (W): 600
Flow rate of carrier gas (L/min): 0.7
Flow rate of makeup gas (L/min): 1
Sampling depth (mm): 18

<Water>

The content of water contained in the chemical liquid which was prepared in each of the examples and the comparative examples and stored in a container was measured using a Karl Fischer moisture meter (trade name "MKC-710M", manufactured by KYOTO ELECTRONICS MANUFACTURING CO., LTD., Karl Fischer coulometric titration method).

[Physical Properties of Chemical Liquid]

The physical properties of the chemical liquid which was prepared in each of the examples and the comparative examples and stored in a container were measured or calculated by the following method.

<Charge Potential>

The charge potential of the chemical liquid which was prepared in each of the examples and the comparative examples and stored in a container was measured by the method based on Japanese Industrial Standards (JIS) C61340-2-2:2013 by using a non-contact type electrostatic potentiometer.

<Number of Coarse Particles>

The number of coarse particles contained in the chemical liquid which was prepared in each of the examples and the comparative examples and stored in a container was measured by the following method.

First, chemical liquid which was prepared in each of the examples and the comparative examples and stored in a container was left to stand for 1 day at room temperature after preparation. By using a light scattering-type liquid-borne particle counter (manufactured by RION Co., Ltd., model number: KS-18F, light source: semiconductor laser-excited solid-state laser (wavelength: 532 nm, rated power: 500 mW), flow rate: 10 mL/min, the measurement principle is based on a dynamic light scattering method), the number of particles having a size equal to or greater than 100 nm contained in 1 mL of the chemical liquid having been left to stand was counted 5 times, and the average thereof was adopted as the number of coarse particles.

The light scattering-type liquid-borne particle counter was used after being calibrated using a Polystyrene Latex (PSL) standard particle solution.

[Evaluation]

The chemical liquid which was prepared in each of the examples and the comparative examples and stored in a container was evaluated by the following method. All of the following evaluation tests were performed in a clean room that met the level equal to or lower than International Organization for Standardization (ISO) Class 2.

(Defect Inhibition Performance)

By using a wafer surface inspection device (SP-5; manufactured by KLA-Tencor Corporation.), the number of particles (hereinafter, referred to as "defects") having a diameter equal to or greater than 32 nm that were present on the surface of a silicon oxide film substrate having a diameter of 300 mm was counted. Then, the silicon oxide film substrate was set in a spin jetting device, and while the silicon oxide film substrate was being rotated, each of the chemical liquids was jetted to the surface of the silicon oxide film substrate at a flow rate of 1.5 L/min. Thereafter, the wafer was spin-dried.

For the obtained dried wafer, by using the aforementioned device (SP-5), the number of defects present on the surface of the silicon oxide film substrate was counted again, and a difference with the initial value (initial value–counted value) was adopted as the number of defects.

Table 1 shows the result obtained by evaluating the obtained number of defects based on the following standards. In a case where the evaluation result based on the following standards is "A" to "C", the chemical liquid is considered as achieving a defect inhibition performance required for a solution used for manufacturing a semiconductor device.

"A": the number of defects was equal to or smaller than 500.

"B": the number of defects was greater than 500 and equal to or smaller than 800.

"C": the number of defects was greater than 800 and equal to or smaller than 1,200.

"D": the number of defects was greater than 1,200.

(Pipe Line Breakage Inhibition Performance)

The chemical liquid was allowed to flow in a pipe line in which a liquid contact portion was formed of PTFE, and the extent to which pinholes or cracks occurred on the pipe line by static electricity that was accumulated on the pipe line and produced sparks was visually inspected.

"AA": the pipe line was not broken, and a scratch causing cracks and/or pinholes was not confirmed on the pipe line.

"A": although the pipe line was not broken, a shallow scratch causing cracks and/or pinholes was confirmed on the pipe line.

"B": although the pipe line was not broken, a deep scratch causing cracks and/or pinholes was confirmed on the pipe line.

"C": it was confirmed that a portion of the pipe line was broken.

"D": it was confirmed that a number of portions of the pipe line were obviously broken.

TABLE 1

| | Organic solvent | | Organic impurity (mass ppm) | Water (% by mass) | Metal ion (mass ppt) | | | | | Particles containing metal atoms (mass ppt) | | | | |
|---|---|---|---|---|---|---|---|---|---|---|---|---|---|---|
| | Type | Content (% by mass) | | | Fe | Cr | Ni | Pb | Total | Cr | Zn | Al | Pb | Total |
| Example 1 | nBA | Balance | 480 ppm | 0.10% | 2 | 1 | 3 | 1 | 7 | 1 | 1 | 1 | 1 | 4 |
| Example 2 | nBA | Balance | 690 ppm | 0.10% | 25 | 12 | 36 | 9 | 82 | 8 | 10 | 5 | 9 | 32 |
| Example 3 | nBA | Balance | 8,400 ppm | 0.10% | 85 | 45 | 79 | 26 | 235 | 45 | 21 | 36 | 11 | 113 |
| Example 4 | PGME | Balance | 550 ppm | 0.10% | 3 | 1 | 4 | 1 | 9 | 2 | 1 | 1 | 1 | 5 |
| Example 5 | PGEE | Balance | 620 ppm | 0.10% | 1 | 2 | 3 | 2 | 8 | 1 | 1 | 2 | 1 | 5 |
| Example 6 | PGPE | Balance | 710 ppm | 0.10% | 2 | 1 | 2 | 1 | 6 | 1 | 1 | 1 | 1 | 4 |
| Example 7 | EL | Balance | 680 ppm | 0.10% | 4 | 1 | 2 | 2 | 9 | 1 | 2 | 1 | 1 | 5 |
| Example 8 | CyPe | Balance | 450 ppm | 0.10% | 3 | 2 | 4 | 1 | 10 | 1 | 1 | 1 | 1 | 4 |
| Example 9 | CyHe | Balance | 580 ppm | 0.10% | 1 | 1 | 2 | 2 | 6 | 1 | 1 | 2 | 1 | 5 |
| Example 11 | PGMEA | Balance | 520 ppm | 0.10% | 3 | 2 | 3 | 1 | 9 | 1 | 1 | 1 | 1 | 4 |
| Example 12 | MIBC | Balance | 630 ppm | 0.10% | 2 | 1 | 4 | 2 | 9 | 2 | 1 | 1 | 1 | 5 |
| Example 13 | nBA | Balance | 3,300 ppm | 0.10% | 12 | 9 | 11 | 9 | 41 | 5 | 4 | 6 | 4 | 19 |
| Example 14 | CyHe | Balance | 3,210 ppm | 0.10% | 11 | 8 | 12 | 8 | 39 | 4 | 6 | 5 | 3 | 18 |
| Example 15 | PGMEA | Balance | 3,630 ppm | 0.10% | 10 | 10 | 10 | 9 | 39 | 6 | 5 | 4 | 5 | 20 |
| Example 16 | nBA | Balance | 10,000 ppm | 0.10% | 36 | 46 | 43 | 45 | 170 | 12 | 13 | 15 | 12 | 52 |
| Example 17 | CyHe | Balance | 10,000 ppm | 0.10% | 41 | 46 | 39 | 47 | 173 | 11 | 12 | 14 | 11 | 48 |
| Example 18 | PGMEA | Balance | 10,000 ppm | 0.10% | 47 | 43 | 41 | 35 | 166 | 16 | 11 | 13 | 10 | 50 |
| Example 19 | nBA | Balance | 480 ppm | 0.10% | 2 | 1 | 3 | 1 | 7 | 1 | 1 | 1 | 1 | 4 |
| Example 20 | CyHe | Balance | 580 ppm | 0.10% | 1 | 1 | 2 | 2 | 6 | 1 | 1 | 2 | 1 | 5 |

TABLE 1-continued

| | | | | | | | | | | | | | | | |
|---|---|---|---|---|---|---|---|---|---|---|---|---|---|---|---|
| Example 21 | PGMEA | Balance | 520 ppm | 0.10% | 3 | 2 | 3 | 1 | 9 | 1 | 1 | 1 | 1 | 4 |
| Example 22 | nBA | Balance | 480 ppm | 0.10% | 2 | 1 | 3 | 1 | 7 | 1 | 1 | 1 | 1 | 4 |

| | Filtering temperature and storage temperature (° C.) | Container Material of liquid contact portion | Cr/Fe | Physical properties of chemical liquid Charge potential (mV) | Number of coarse particles (number/ml) | Evaluation Defect inhibition performance | Pipe line breakage inhibition performance |
|---|---|---|---|---|---|---|---|
| Example 1 | 20 | SUS (1) | 2.8 | <20 | 8 | A | A |
| Example 2 | 20 | SUS (1) | 2.8 | <20 | 15 | B | B |
| Example 3 | 20 | SUS (1) | 2.8 | <20 | 23 | C | C |
| Example 4 | 20 | SUS (1) | 2.8 | <20 | 7 | A | A |
| Example 5 | 20 | SUS (1) | 2.8 | <20 | 6 | A | A |
| Example 6 | 20 | SUS (1) | 2.8 | <20 | 8 | A | A |
| Example 7 | 20 | SUS (1) | 2.8 | <20 | 9 | A | A |
| Example 8 | 20 | SUS (1) | 2.8 | <20 | 8 | A | A |
| Example 9 | 20 | SUS (1) | 2.8 | <20 | 7 | A | A |
| Example 11 | 20 | SUS (1) | 2.8 | <20 | 8 | A | A |
| Example 12 | 20 | SUS (1) | 2.8 | <20 | 8 | A | A |
| Example 13 | 20 | SUS (1) | 2.8 | <20 | 21 | B | A |
| Example 14 | 20 | SUS (1) | 2.8 | <10 | 25 | B | A |
| Example 15 | 20 | SUS (1) | 2.8 | <10 | 23 | B | A |
| Example 16 | 20 | SUS (1) | 2.8 | <10 | 45 | C | B |
| Example 17 | 20 | SUS (1) | 2.8 | <10 | 53 | C | B |
| Example 18 | 20 | SUS (1) | 2.8 | <10 | 56 | C | B |
| Example 19 | 15 | SUS (1) | 2.8 | <10 | 8 | A | A |
| Example 20 | 15 | SUS (1) | 2.8 | <10 | 7 | A | A |
| Example 21 | 15 | SUS (1) | 2.8 | <10 | 8 | A | A |
| Example 22 | 5 | SUS (1) | 2.8 | <5 | 8 | A | AA |

TABLE 2

| | Chemical liquid | | | | | | | | | | | | |
|---|---|---|---|---|---|---|---|---|---|---|---|---|---|
| | Organic solvent | | | | | | | | Particles containing metal atoms (mass ppt) | | | | |
| | Type | Content (% by mass) | Organic impurity (mass ppm) | Water (% by mass) | Metal ion (mass ppt) | | | | | | | | |
| | | | | | Fe | Cr | Ni | Pb | Total | Cr | Zn | Al | Pb | Total |
| Example 23 | CyHe | Balance | 580 ppm | 0.10% | 1 | 1 | 2 | 2 | 6 | 1 | 1 | 2 | 1 | 5 |
| Example 24 | PGMEA | Balance | 520 ppm | 0.10% | 3 | 2 | 3 | 1 | 9 | 1 | 1 | 1 | 1 | 4 |
| Example 25 | nBA | Balance | 500 ppm | 1.50% | 2 | 1 | 3 | 1 | 7 | 1 | 1 | 1 | 1 | 4 |
| Example 26 | CyHe | Balance | 530 ppm | 1.50% | 2 | 1 | 3 | 1 | 7 | 1 | 1 | 1 | 1 | 4 |
| Example 27 | PGMEA | Balance | 510 ppm | 1.50% | 2 | 1 | 3 | 1 | 7 | 1 | 1 | 1 | 1 | 4 |
| Example 28 | nBA | Balance | 580 ppm | 0.10% | 2 | 1 | 3 | 1 | 7 | 1 | 1 | 1 | 1 | 4 |
| Example 29 | CyHe | Balance | 540 ppm | 0.10% | 2 | 1 | 3 | 1 | 7 | 1 | 1 | 1 | 1 | 4 |
| Example 30 | PGMEA | Balance | 610 ppm | 0.10% | 2 | 1 | 3 | 1 | 7 | 1 | 1 | 1 | 1 | 4 |
| Example 31 | nBA | Balance | 780 ppm | 0.10% | 40 | 26 | 39 | 9 | 114 | 40 | 26 | 39 | 9 | 114 |
| Example 32 | nBA | Balance | 480 ppm | 0.10% | 25 | 13 | 21 | 4 | 63 | 25 | 13 | 21 | 4 | 63 |
| Example 33 | nBA | Balance | 480 ppm | 0.10% | 12 | 6 | 7 | 2 | 27 | 12 | 6 | 7 | 2 | 27 |
| Example 34 | nBA | Balance | 480 ppm | 0.10% | 1 | 1 | 2 | 1 | 5 | 1 | 1 | 1 | 1 | 4 |
| Example 35 | nBA | Balance | 510 ppm | 0.10% | 2 | 1 | 3 | 1 | 7 | 0.02 | 0.01 | 0.03 | 0.02 | 0.08 |
| Example 36 | nBA | Balance | 0.8 ppm | 0.10% | 2 | 1 | 3 | 1 | 7 | 1 | 1 | 1 | 1 | 4 |
| Example 37 | nBA | Balance | 580 ppm | 0.10% | 2 | 1 | 3 | 1 | 7 | 1 | 1 | 1 | 1 | 4 |
| Example 38 | nBA | Balance | 550 ppm | 0.008% | 2 | 1 | 3 | 1 | 7 | 1 | 1 | 1 | 1 | 4 |
| Example 39 | nBA | Balance | 610 ppm | 0.10% | 2 | 1 | 3 | 1 | 7 | 1 | 1 | 1 | 1 | 4 |
| Example 40 | nBA | Balance | 480 ppm | 0.10% | 2 | 1 | 3 | 1 | 7 | 1 | 1 | 1 | 1 | 4 |
| Comparative Example 1 | nBA | Balance | 480 ppm | 0.10% | 2 | 1 | 3 | 1 | 7 | 1 | 1 | 1 | 1 | 4 |
| Comparative Example 2 | nBA | Balance | 480 ppm | 0.10% | 253 | 216 | 196 | 273 | 938 | 105 | 101 | 118 | 110 | 434 |

TABLE 2-continued

| | | | | | | | | | | | | | |
|---|---|---|---|---|---|---|---|---|---|---|---|---|---|
| Comparative Example 3 | CyHe | Balance | 480 ppm | 0.10% | 2 | 1 | 3 | 1 | 7 | 1 | 1 | 1 | 1 | 4 |
| Comparative Example 4 | nBA | Balance | 580 ppm | 0.10% | 0.06 | 0.03 | 0.05 | 0.02 | 0.16 | 1 | 1 | 1 | 1 | 4 |

| | Filtering temperature and storage temperature (° C.) | Container | | Physical properties of chemical liquid | | Evaluation | |
|---|---|---|---|---|---|---|---|
| | | Material of liquid contact portion | Cr/Fe | Charge potential (mV) | Number of coarse particles (number/ml) | Defect inhibition performance | Pipe line breakage inhibition performance |
| Example 23 | 5 | SUS (1) | 2.8 | <5 | 7 | A | AA |
| Example 24 | 5 | SUS (1) | 2.8 | <5 | 8 | A | AA |
| Example 25 | 20 | SUS (1) | 2.8 | <20 | 8 | C | A |
| Example 26 | 20 | SUS (1) | 2.8 | <20 | 7 | C | A |
| Example 27 | 20 | SUS (1) | 2.8 | <20 | 8 | C | A |
| Example 28 | 20 | SUS (1) | 2.8 | <20 | 165 | C | A |
| Example 29 | 20 | SUS (1) | 2.8 | <20 | 179 | C | A |
| Example 30 | 20 | SUS (1) | 2.8 | <20 | 185 | C | A |
| Example 31 | 20 | SUS (1) | 0.4 | <20 | 15 | C | C |
| Example 32 | 20 | SUS (1) | 1 | <20 | 10 | B | C |
| Example 33 | 20 | SUS (1) | 2 | <20 | 8 | B | A |
| Example 34 | 20 | SUS (1) | 3 | <20 | 7 | A | A |
| Example 35 | 20 | SUS (1) | 2.8 | <20 | 6 | B | B |
| Example 36 | 20 | SUS (1) | 2.8 | <20 | 10 | B | C |
| Example 37 | 20 | SUS (1) | 2.8 | <20 | 0 | B | B |
| Example 38 | 20 | SUS (1) | 2.8 | <20 | 15 | C | B |
| Example 39 | 25 | SUS (1) | 2.8 | <30 | 8 | B | A |
| Example 40 | 20 | SUS (1) | 4.2 | <20 | 16 | C | B |
| Comparative Example 1 | 20 | PTFE | — | 158 | 10 | B | D |
| Comparative Example 2 | 20 | SUS (1) | 0.1 | <20 | 256 | D | C |
| Comparative Example 3 | 20 | PTFE | — | 192 | 10 | B | D |
| Comparative Example 4 | 20 | SUS (1) | 2.8 | <20 | 8 | D | A |

In Table 1, the organic impurities contained in the chemical liquids of Examples 3 and 16 to 18 are as below.
Example 3: 1-butanol (5,000 mass ppm) and isoamyl acetate (3,400 mass ppm)
Example 16: 1-butanol (5,000 mass ppm) and isoamyl acetate (5,000 mass ppm)
Example 17: cyclohexanol (5,000 mass ppm) and 1,4-dicyclohexanol (5,000 mass ppm)
Example 18: propylene glycol (5,000 mass ppm) and acetic acid (5,000 mass ppm)
The abbreviations in Table 1 represent the following.
SUS (1): electropolished stainless steel (here, for adjusting Cr/Fe, the condition of electropolishing was changed.)
PTFE: polytetrafluoroethylene
Regarding the content of the organic solvent, "balance" means the content of the organic solvent obtained by subtracting the content of the organic impurity, the content of water, the content of the metal ion, and the content of the particles containing metal atoms from the total mass of the chemical liquid. In all of the examples and the comparative examples, the content of the organic solvent was equal to or greater than 98% by mass.

From the results described in Table 1, it was confirmed that the chemical liquids of Examples 1 to 40 had the effects of the present invention. In contrast, the chemical liquids of Comparative Examples 1 to 4 did not have the effects of the present invention.

The chemical liquid of Example 1, in which the content of the particles containing metal atoms was 0.1 to 100 mass ppt, had further improved effects of the present invention compared to the chemical liquid (the content of the particles was greater than the upper limit) of Example 3. Furthermore, the chemical liquid of Example 1 had further improved effects of the present invention compared to the chemical liquid (the content of the particles was less than the lower limit) of Example 35.

The chemical liquid of Example 1 containing an organic impurity, in which the content of the organic impurity was 1 to 5,000 mass ppt, had further improved effects of the present invention compared to the chemical liquid (the content of the organic impurity was greater than the upper limit) of Example 16. Furthermore, the chemical liquid of Example 1 had further improved effects of the present invention compared to the chemical liquid (the content of the organic impurity was less than the lower limit) of Example 36.

The chemical liquid of Example 1, in which the number of coarse particles was 1 to 100/mL, had further improved defect inhibition performance compared to the chemical liquid (the number of coarse particles was greater than the upper limit) of Example 28. Furthermore, the chemical liquid of Example 1 had further improved effects of the present invention compared to the chemical liquid (the number of coarse particles was less than the lower limit) of Example 37.

The chemical liquid of Example 1, in which the content of water was 0.01% to 1% by mass, had further improved defect inhibition performance compared to the chemical liquid (the content of water was greater than the upper limit) of Example 25. Furthermore, the chemical liquid of Example 1 had further improved effects of the present invention compared to the chemical liquid of Example 38.

In the chemical liquid storage body of Example 1, in which the liquid contact portion of the container was formed of a metallic material containing a Cr atom and an Fe atom and Cr/Fe in the metallic material was higher than 0.5 and less than 3.5, the stored chemical liquid had further improved effects of the present invention than in the chemical liquid storage body (Cr/Fe was less than the lower limit) of Example 31. Meanwhile, in the chemical liquid storage body of Example 1, the stored chemical liquid had further improved effects of the present invention than in the chemical liquid storage body (Cr/Fe was higher than the upper limit) of Example 40.

What is claimed is:

1. A chemical liquid comprising;
an organic solvent;
an ion of at least one kind of atom selected from the group consisting of an Fe atom, a Cr atom, a Ni atom, and a Pb atom, and
an organic impurity,
wherein in a case where the chemical liquid contains one kind of the ion, a content of the ion is 0.1 to 100 mass ppt,
in a case where the chemical liquid contains two or more kinds of the ions, a content of each of the ions is 0.1 to 100 mass ppt,
a charge potential of the chemical liquid is equal to or lower than 100 mV, and
a total content of the organic impurity in the chemical liquid is 1 to 3,000 mass ppm.

2. The chemical liquid according to claim 1, further comprising:
particles containing at least one kind of atom selected from the group consisting of a Cr atom, a Zn atom, an Al atom, and a Pb atom,
wherein a content of the particles in the chemical liquid with respect to the total mass of the chemical liquid is 0.1 to 100 mass ppt.

3. The chemical liquid according to claim 1,
wherein a number of objects to be counted having a size equal to or greater than 0.1 μm that are counted by a light scattering-type liquid-borne particle counter is 1 to 100/mL.

4. The chemical liquid according to claim 1, further comprising:
water,
wherein a content of the water in the chemical liquid is 0.01% to 1% by mass.

5. The chemical liquid according to claim 1,
wherein the organic solvent contains at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol.

6. A chemical liquid storage body comprising;
a container; and
the chemical liquid according to claim 1 that is stored in the container,
wherein a liquid contact portion, which contacts the chemical liquid, in the container is formed of a metallic material containing a Cr atom and an Fe atom, and
the metallic material is at least one kind of material selected from the group consisting of stainless steel and electropolished stainless steel.

7. The chemical liquid storage body according to claim 6,
wherein a mass ratio of a content of the Cr atom to a content of the Fe atom in the metallic material is higher than 0.5 and less than 3.5.

8. A manufacturing method of a chemical liquid that is for manufacturing the chemical liquid according to claim 1, comprising:
an organic solvent preparation step of preparing an organic solvent; and
a filtering step of passing a substance to be purified containing the organic solvent through a filter so as to obtain a chemical liquid,
wherein the filtering step satisfies a condition 1 and a condition 2 described below,
condition 1: at the time when the substance to be purified passes through the filter, a temperature of the substance to be purified is lower than 23° C.,
condition 2: at the time when the substance to be purified passes through the filter, a temperature of the substance to be purified satisfies Expression 1,
(Expression 1) a temperature of the substance to be purified<a flashing point of the organic solvent−5
in Expression 1, the unit of each of the temperature of the substance to be purified and the flashing point of the organic solvent is ° C.

9. A manufacturing method of a chemical liquid storage body that is for manufacturing the chemical liquid storage body according to claim 6, comprising:
an organic solvent preparation step of preparing an organic solvent;
a filtering step of passing a substance to be purified containing the organic solvent through a filter so as to obtain a chemical liquid; and
a storing step of storing the chemical liquid in a container so as to obtain a chemical liquid storage body,
wherein the filtering step and the storing step satisfy a condition 3 and a condition 4 described below,
condition 3: at the time when the substance to be purified passes through the filter, a temperature of the substance to be purified is lower than 23° C., and at the time when the chemical liquid is stored in the container, a temperature of the chemical liquid is lower than 23° C.,
condition 4: at the time when the substance to be purified passes through the filter, a temperature of the substance to be purified satisfies Expression 1, and at the time when the chemical liquid is stored in the container, a temperature of the chemical liquid satisfies Expression 2,
(Expression 1) a temperature of the substance to be purified<a flashing point of the organic solvent−5,
(Expression 2) a temperature of the chemical liquid<a flashing point of the organic solvent−5,
in Expression 1 and Expression 2, the unit of each of the temperature of the substance to be purified, the temperature of the chemical liquid, and the flashing point of the organic solvent is ° C.

10. A manufacturing method of a chemical liquid storage body that is for manufacturing the chemical liquid storage body according to claim 7, comprising:
an organic solvent preparation step of preparing an organic solvent;

a filtering step of passing a substance to be purified containing the organic solvent through a filter so as to obtain a chemical liquid; and a storing step of storing the chemical liquid in a container so as to obtain a chemical liquid storage body, wherein the filtering step and the storing step satisfy a condition 3 and a condition 4 described below, condition 3: at the time when the substance to be purified passes through the filter, a temperature of the substance to be purified is lower than 23° C., and at the time when the chemical liquid is stored in the container, a temperature of the chemical liquid is lower than 23° C., condition 4: at the time when the substance to be purified passes through the filter, a temperature of the substance to be purified satisfies Expression 1, and at the time when the chemical liquid is stored in the container, a temperature of the chemical liquid satisfies Expression 2, (Expression 1) a temperature of the substance to be purified<a flashing point of the organic solvent−5, (Expression 2) a temperature of the chemical liquid<a flashing point of the organic solvent−5, in Expression 1 and Expression 2, the unit of each of the temperature of the substance to be purified, the temperature of the chemical liquid, and the flashing point of the organic solvent is ° C.

11. The chemical liquid according to claim 1, wherein the chemical liquid contains an Fe ion, a Cr ion, a Ni ion, and a Pb ion, a content of the Fe ion with respect to the total mass of the chemical liquid is 0.1 to 10 mass ppt, a content of the Cr ion with respect to the total mass of the chemical liquid is 0.1 to 10 mass ppt, a content of the Ni ion with respect to the total mass of the chemical liquid is 0.1 to 10 mass ppt, and a content of the Pb ion with respect to the total mass of the chemical liquid is 0.1 to 10 mass ppt.

12. The chemical liquid according to claim 1, wherein the chemical liquid contains particles containing Fe atoms, particles containing Zn atoms, particles containing Al atoms, and particles containing Pb atoms, a content of the particles containing Fe atoms with respect to the total mass of the chemical liquid is 0.1 to 30 mass ppt, a content of the particles containing Zn atoms with respect to the total mass of the chemical liquid is 0.1 to 20 mass ppt, a content of the particles containing Al atoms with respect to the total mass of the chemical liquid is 0.1 to 20 mass ppt, and a content of the particles containing Pb atoms with respect to the total mass of the chemical liquid is 0.1 to 20 mass ppt.

13. The chemical liquid according to claim 2, further comprising:

an organic impurity, wherein a total content of the organic impurity in the chemical liquid is 1 to 5,000 mass ppm.

14. The chemical liquid according to claim 2, wherein the number of objects to be counted having a size equal to or greater than 0.1 μm that are counted by a light scattering-type liquid-borne particle counter is 1 to 100/mL.

15. The chemical liquid according to claim 2, further comprising:

water, wherein a content of the water in the chemical liquid is 0.01% to 1% by mass.

16. The chemical liquid according to claim 3, further comprising:

water, wherein a content of the water in the chemical liquid is 0.01% to 1% by mass.

17. The chemical liquid according to claim 2, wherein the organic solvent contains at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol.

18. A chemical liquid comprising;

an organic solvent, an ion of at least one kind of atom selected from the group consisting of an Fe atom, a Cr atom, a Ni atom, and a Pb atom, and water, wherein in a case where the chemical liquid contains one kind of the ion, a content of the ion is 0.1 to 100 mass ppt, in a case where the chemical liquid contains two or more kinds of the ions, a content of each of the ions is 0.1 to 100 mass ppt, a charge potential of the chemical liquid is equal to or lower than 100 mV, and a content of the water in the chemical liquid is 0.01% to 1% by mass.

19. The chemical liquid according to claim 18, further comprising:

particles containing at least one kind of atom selected from the group consisting of a Cr atom, a Zn atom, an Al atom, and a Pb atom, wherein a content of the particles in the chemical liquid with respect to the total mass of the chemical liquid is 0.1 to 100 mass ppt.

20. The chemical liquid according to claim 18, further comprising:

an organic impurity, wherein a total content of the organic impurity in the chemical liquid is 1 to 5,000 mass ppm.

21. The chemical liquid according to claim 18, wherein the number of objects to be counted having a size equal to or greater than 0.1 μm that are counted by a light scattering-type liquid-borne particle counter is 1 to 100/mL.

22. The chemical liquid according to claim 18, wherein the organic solvent contains at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, and 4-methyl-2-pentanol.

* * * * *